(12) United States Patent
Lin et al.

(10) Patent No.: US 12,074,154 B2
(45) Date of Patent: *Aug. 27, 2024

(54) PACKAGE STRUCTURE

(71) Applicant: Taiwan Semiconductor Manufacturing Company, Ltd., Hsinchu (TW)

(72) Inventors: Tsung-Shu Lin, New Taipei (TW); Tsung-Yu Chen, Hsinchu (TW); Wensen Hung, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/584,308

(22) Filed: Jan. 25, 2022

(65) Prior Publication Data

US 2022/0149030 A1   May 12, 2022

Related U.S. Application Data

(63) Continuation of application No. 16/877,504, filed on May 19, 2020, now Pat. No. 11,282,825.

(51) Int. Cl.
*H01L 25/18* (2023.01)
*H01L 23/00* (2006.01)
(Continued)

(52) U.S. Cl.
CPC .......... *H01L 25/18* (2013.01); *H01L 23/3135* (2013.01); *H01L 23/4006* (2013.01);
(Continued)

(58) Field of Classification Search
CPC . H01L 23/3135; H01L 23/4006; H01L 23/46; H01L 23/49816; H01L 23/49833;
(Continued)

(56) References Cited

U.S. PATENT DOCUMENTS 5,866,943 A * 2/1999 Mertol ................ H01L 24/91
257/E23.101
9,000,584 B2 4/2015 Lin et al.
(Continued)

FOREIGN PATENT DOCUMENTS

CN 110620095 12/2019
KR 101496085 2/2015

OTHER PUBLICATIONS

"Notice of allowance of Korea Counterpart Application", dated Apr. 7, 2022, p. 1-p. 6.
(Continued)

*Primary Examiner* — Jasmine J Clark
(74) *Attorney, Agent, or Firm* — JCIPRNET

(57) ABSTRACT

A structure including a wiring substrate, an interposer disposed on and electrically connected to the wiring substrate, a semiconductor die disposed on and electrically connected to the interposer, a first insulating encapsulation disposed on the interposer, a second insulating encapsulation disposed on the wiring substrate, and a lid is provided. The semiconductor die is laterally encapsulated by the first insulating encapsulation. The semiconductor die and the first insulating encapsulation are laterally encapsulated by the second insulating encapsulation. A top surface of the first insulating encapsulation is substantially leveled with a top surface of the second insulating encapsulation and a surface of the semiconductor die. The lid is disposed on the semiconductor die, the first insulating encapsulation and the second insulating encapsulation.

20 Claims, 26 Drawing Sheets

(51) Int. Cl.
  *H01L 23/31* (2006.01)
  *H01L 23/40* (2006.01)
  *H01L 23/46* (2006.01)
  *H01L 23/498* (2006.01)

(52) U.S. Cl.
  CPC ........ *H01L 23/46* (2013.01); *H01L 23/49816* (2013.01); *H01L 23/49833* (2013.01); *H01L 24/16* (2013.01); H01L 2023/405 (2013.01); H01L 2023/4087 (2013.01); H01L 2224/16227 (2013.01)

(58) Field of Classification Search
  CPC ....... H01L 2223/405; H01L 2223/4087; H01L 24/16; H01L 2224/16227; H01L 25/18; H10B 80/00; H10N 19/00; H10N 79/00
  USPC ......................................................... 257/675
  See application file for complete search history.

(56) References Cited

U.S. PATENT DOCUMENTS

| | | | |
|---|---|---|---|
| 9,034,695 B2* | 5/2015 | Hsieh | H01L 23/427 |
| | | | 257/E23.101 |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,163,754 B2 | 12/2018 | Ho et al. | |
| 11,282,825 B2* | 3/2022 | Lin | H01L 25/18 |
| 2013/0208426 A1* | 8/2013 | Kim | H01L 25/0657 |
| | | | 361/717 |
| 2016/0163657 A1 | 6/2016 | Hung | |
| 2017/0263589 A1 | 9/2017 | Chang Chien et al. | |
| 2017/0358556 A1* | 12/2017 | Bitz | H01L 25/0657 |

OTHER PUBLICATIONS

"Office Action of Germany Counterpart Application", issued on Jul. 24, 2023, p. 1-p. 7.

* cited by examiner

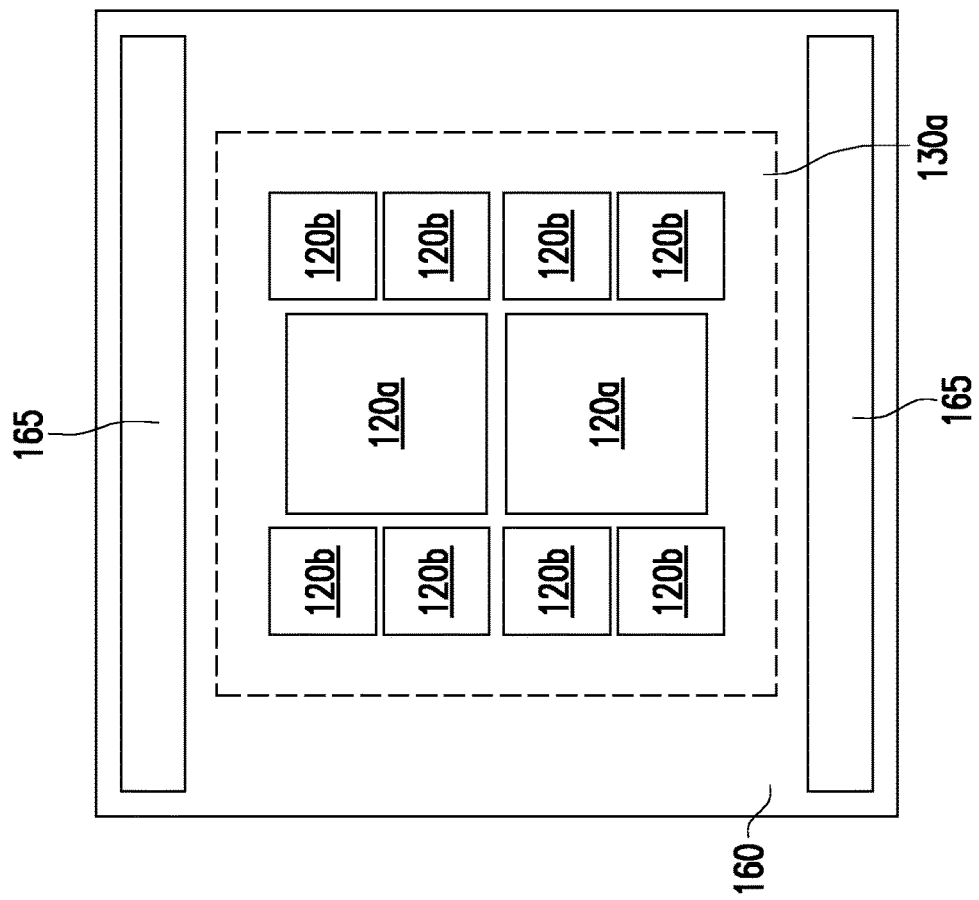
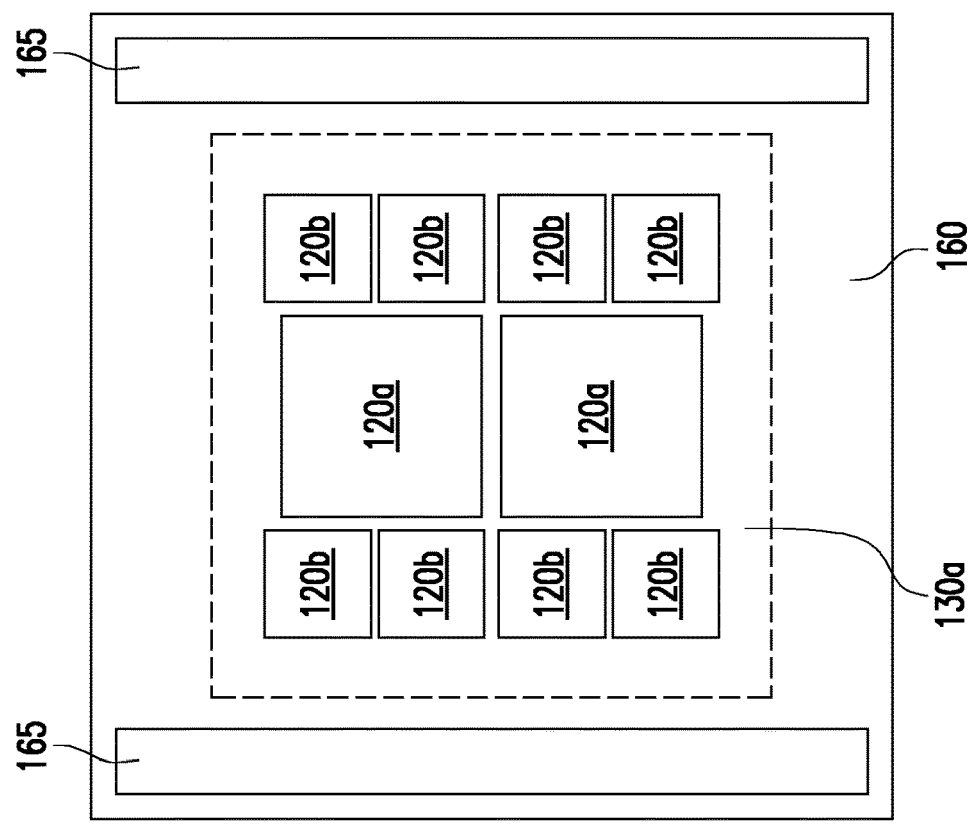

PACKAGE STRUCTURE

CROSS-REFERENCE TO RELATED APPLICATION

This application a continuation application of and claims the priority benefit of U.S. application Ser. No. 16/877,504, filed on May 19, 2020, now U.S. Pat. No. 11,282,825. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and thermally enhanced packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A through FIG. 13G are top views schematically illustrating various reinforcement structures in accordance with some other embodiments of the present disclosure.

DETAILED DESCRIPTION

Figure 1:
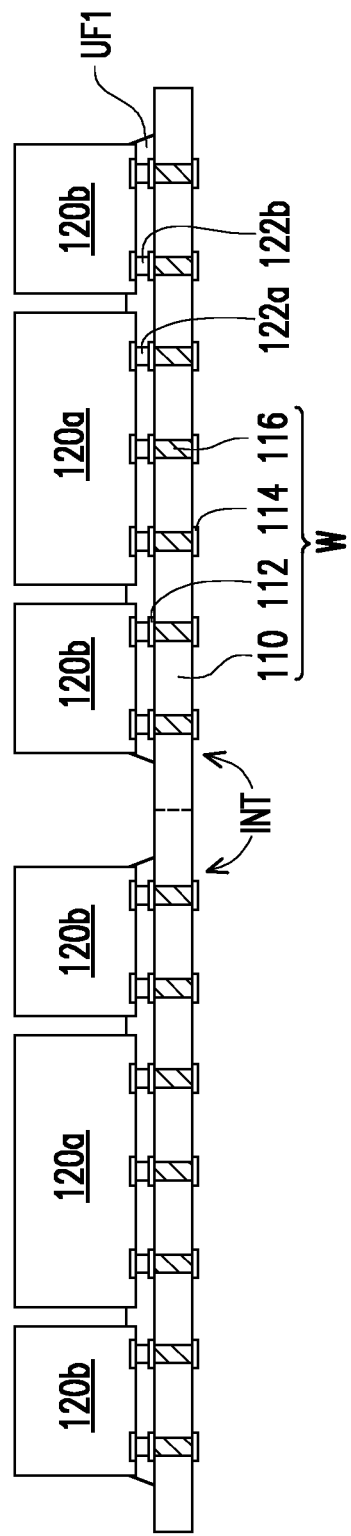
FIG. 1 through FIG. 7 are cross-sectional views schematically illustrating a process flow for fabricating a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 7 are cross-sectional views schematically illustrating a process flow for fabricating a package structure in accordance with some embodiments of the present disclosure.

Referring to FIG. 1, an interposer wafer W including interposers INT arranged in array is provided. The interposer wafer W may be a silicon interposer wafer including multiple silicon interposers or other suitable semiconductor interposer wafer. The interposer wafer W may include a substrate 110, bump pads 112 disposed on an upper surface of the substrate 110, bump pads 114 disposed on a lower surface of the substrate 110, and through semiconductor vias (TSVs) 116 penetrating through the substrate 110, wherein the bump pads 112 are electrically connected to the bump pads 114 through the TSVs 116. Semiconductor dies 120a and semiconductor dies 120b are provided and mounted on a surface of the interposer wafer W such that the semiconductor dies 120a and semiconductor dies 120b are electrically connected to the interposers INT of the interposer wafer W. In some embodiments, the semiconductor dies 120a and semiconductor dies 120b are electrically connected to the bump pads 112 of the interposer wafer W through conductive bumps 122a and conductive bumps 122b. The conductive bumps 122a are located between the semiconductor dies 120a and the bump pads 112, and the conductive bumps 122b are located between the semiconductor dies 120b and the bump pads 112. In some embodiments, the conductive bumps 122a may be formed on the semiconductor dies 120a before the semiconductor dies 120a are mounted on the interposer wafer W, and the conductive bumps 122b may be formed on the semiconductor dies 120b before the semiconductor dies 120b are mounted on the interposer wafer W. The conductive bumps 122a may be formed through a wafer-level bumping process performed on semiconductor wafers including the semiconductor dies 120a arranged in array, and the conductive bumps 122b may be formed through another wafer-level bumping process performed on semiconductor wafers including the semiconductor dies 120b arranged in array. In some embodiments, the semiconductor dies 120a includes logic dies, System-on-Chip (SoC) dies or other suitable semiconductor dies, and the semiconductor dies 120b includes High Bandwidth Memory (HBM) cubes each having stacked memory dies or other suitable semiconductor dies.

In some embodiments, the conductive bumps 122a and the conductive bumps 122b include micro bumps. The conductive bumps 122a and the conductive bumps 122b may each include a copper (Cu) pillar covered by a nickel (Ni) cap, and the nickel (Ni) cap may be electrically connected to the bump pads 112 through solder material. For example, the solder material includes Sn—Ag solder material or other suitable solder material.

After the semiconductor dies 120a and the semiconductor dies 120b are mounted on and electrically connected to the interposer wafer W through the conductive bumps 122a and the conductive bumps 122b, underfills UF1 are formed over the interposer wafer W to fill gaps between the semiconductor dies 120a and the interposer wafer W as well as gaps between the semiconductor dies 120b and the interposer wafer W. The conductive bumps 122a and the conductive bumps 122b are laterally encapsulated and protected by the underfills UF1 such that damage of the conductive bumps 122a and the conductive bumps 122b resulted from Coefficient of Thermal Expansion (CTE) mismatch between the interposer wafer W and the semiconductor dies 120a and 120b may be prevented. Accordingly, reliability of the conductive bumps 122a and the conductive bumps 122b may be improved.

Figure 2:
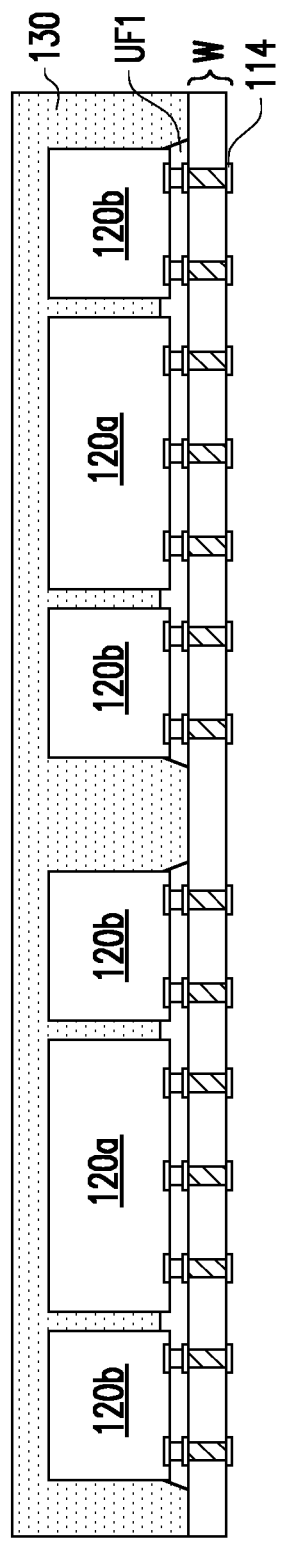
Figure 3:
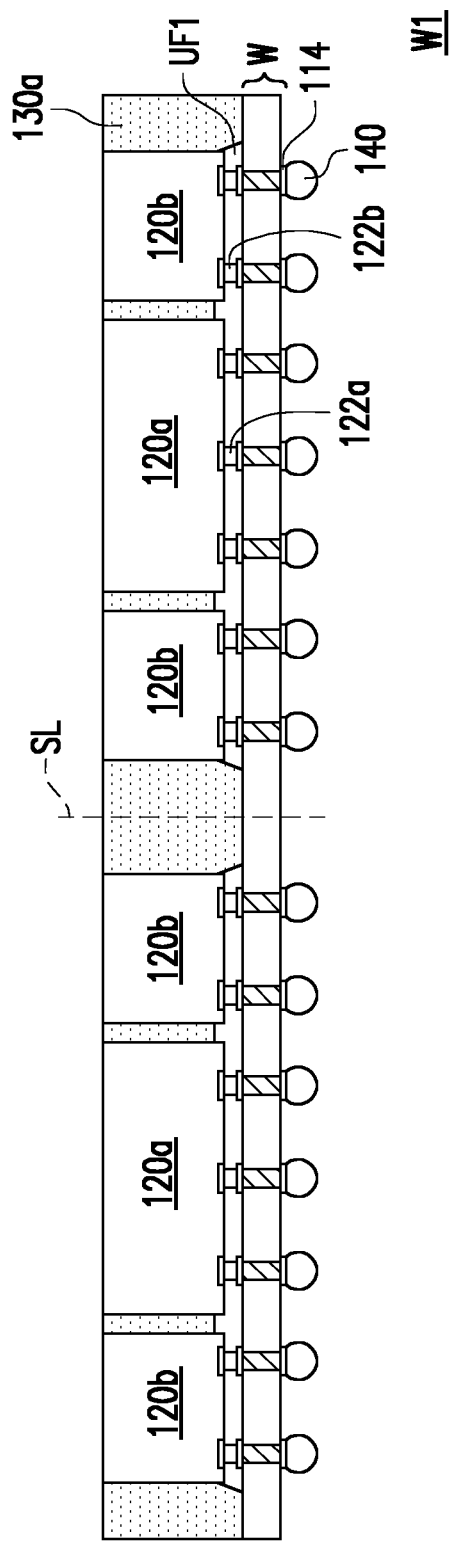

Referring to FIG. 2 and FIG. 3, an insulating material 130 is formed over the interposer wafer W to cover the semiconductor dies 120a and the semiconductor dies 120b. The insulating material 130 may be formed by an over-molding process or a deposition process followed by a removal process. In some embodiments, an insulating material 130 such as epoxy resin is formed on the interposer wafer W to cover the back surfaces and sidewalls of the semiconductor dies 120a and 120b through an over-molding process, and a grinding process, a chemical mechanical polishing (CMP) process or other suitable removal process is then performed to remove portions of the epoxy resin until the back surfaces of the semiconductor dies 120a and 120b are revealed. In some alternative embodiments, an insulating material 130 such as tetraethoxysilane (TEOS) formed oxide is formed on the interposer wafer W to cover back surfaces and sidewalls of the semiconductor dies 120a and 120b through a chemical vapor deposition (CVD) process, and a grinding process, a CMP process or other suitable removal process is then performed to remove portions of the TEOS formed oxide until the back surfaces of the semiconductor dies 120a and 120b are revealed. After performing the above-mentioned removal process, as illustrated in FIG. 3, an insulating encapsulation 130a is formed to laterally encapsulate the semiconductor dies 120a and 120b, and the top surface of the insulating encapsulation 130a is substantially leveled with the back surfaces of the semiconductor dies 120a and 120b.

In some embodiments, during the removal process of the insulating material 130, the insulating material 130, the semiconductor dies 120a and the semiconductor dies 120b are partially removed such that the thickness of the semiconductor dies 120a and the semiconductor dies 120b is reduced.

A wafer-level bumping process may be performed such that conductive bumps 140 are formed over bump pads 114 of the interposer wafer W. In some embodiments, the wafer-level bumping process for forming the conductive bumps 140 is performed before formation of the insulating encapsulation 130a. In some alternative embodiments, the wafer-level bumping process for forming the conductive bumps 140 is performed after formation of the insulating encapsulation 130a.

After forming the insulating encapsulation 130a and the conductive bumps 140, a reconstructed wafer W1 including the interposer wafer W, the semiconductor dies 120a, the semiconductor dies 120b, the underfills UF1, the insulating encapsulation 130a, and the conductive bumps 140 is formed.

Figure 4:
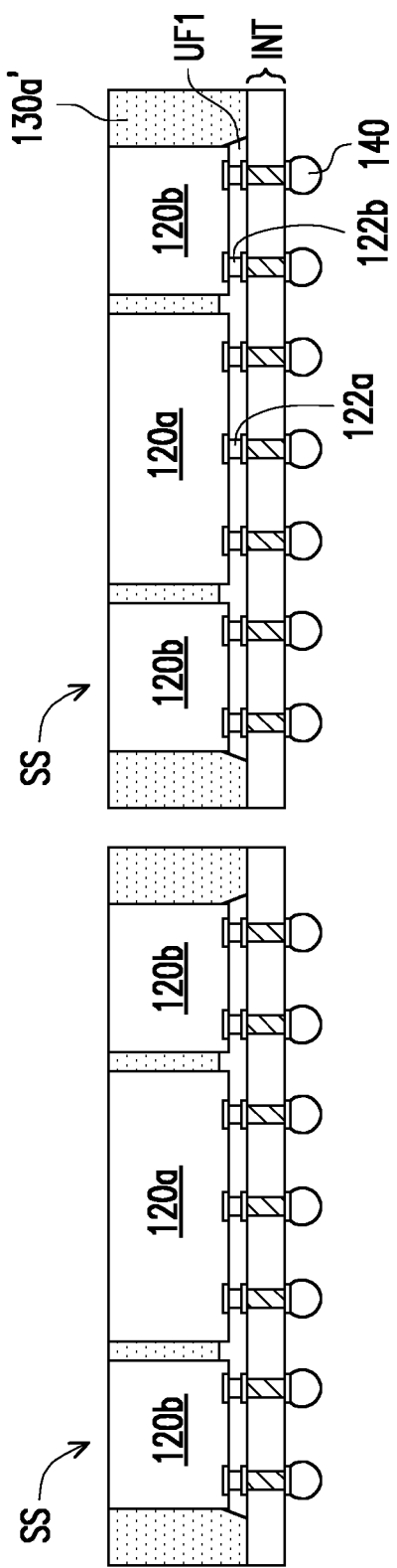

Referring to FIG. 3 and FIG. 4, a wafer saw process is then performed along scribe lines SL such that the reconstructed wafer W1 is singulated into multiple singulated structures SS. The singulated structures SS may each include an interposer INT, at least one semiconductor die 120a, at least one semiconductor dies 120b, conductive bumps 122a, conductive bumps 122b, an underfill UF1, an insulating encapsulation 130a', and conductive bumps 140. The conductive bumps 122a are electrically connected between the semiconductor die 120a and the interposer INT. The conductive bumps 122b are electrically connected between the semiconductor die 120b and the interposer INT. The underfill UF1 laterally encapsulates the conductive bumps 122a and 122b. The underfill UF1 may further cover sidewalls of the semiconductor dies 120a and 120b. The insulating encapsulation 130a' laterally encapsulates the semiconductor dies 120a and 120b, wherein sidewalls of the insulating encapsulation 130a' are substantially aligned with sidewalls of the interposer INT. Furthermore, the conductive bumps 122a and 122b are disposed on a surface (e.g., an upper surface) of the interposer INT, and the conductive bumps 140 are disposed on another surface (e.g., a lower surface) of the interposer INT.

Figure 5:
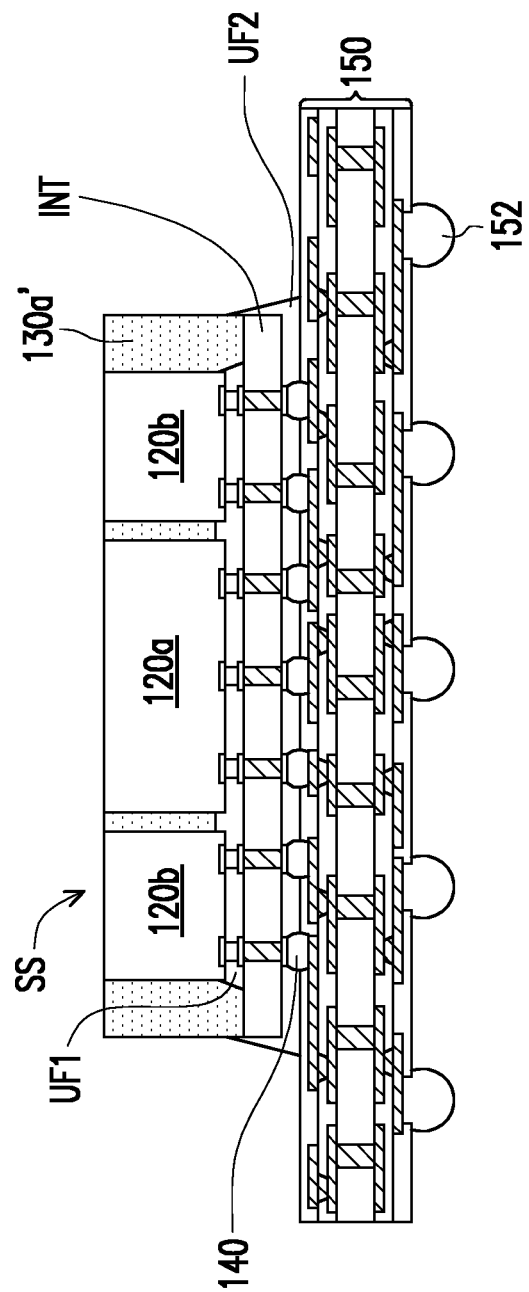

Referring to FIG. 5, a wiring substrate 150 including conductive terminals 152 formed thereon is provided. In some embodiments, the wiring substrate 150 includes a dielectric core layer, build-up or laminated dielectric layers stacked over opposite surfaces of the dielectric core layer, conductive wiring layers embedded in the build-up or laminated dielectric layers, conductive vias penetrating through the dielectric core layer and the build-up or laminated dielectric layers. The conductive terminals 150 is formed on a lower surface of the wiring substrate 150 and electrically connected to the bottommost conductive wiring layer of the wiring substrate 150.

At least one of the singulated structures SS singulated from the reconstructed wafer W1 illustrated in FIG. 3 may be picked-up and placed on an upper surface of the wiring substrate 150. The singulated structure SS is electrically connected to the conductive wirings of the wiring substrate 150 through the conductive bumps 140. After the at least one singulated structure SS is mounted on the wiring substrate 150, an underfill UF2 may be formed to fill a gap between the wiring substrate 150 and the interposer INT of the singulated structure SS. The conductive bumps 140 are laterally encapsulated and protected by the underfill UF2 such that damage of the conductive bumps 140 resulted from CTE mismatch between the interposer INT and the wiring substrate 150 may be prevented. Accordingly, reliability of the conductive bumps 140 may be improved.

In some embodiments, the underfill UF2 not only fills the gap between the wiring substrate 150 and the interposer INT of the singulated structure SS, but also covers sidewalls of the singulated structure SS. As illustrated in FIG. 5, the underfill UF2 not only fills the gap between the wiring substrate 150 and the interposer INT of the singulated structure SS, but also covers sidewalls of the interposer INT and sidewalls of the insulating encapsulation 130a'.

Figure 6:
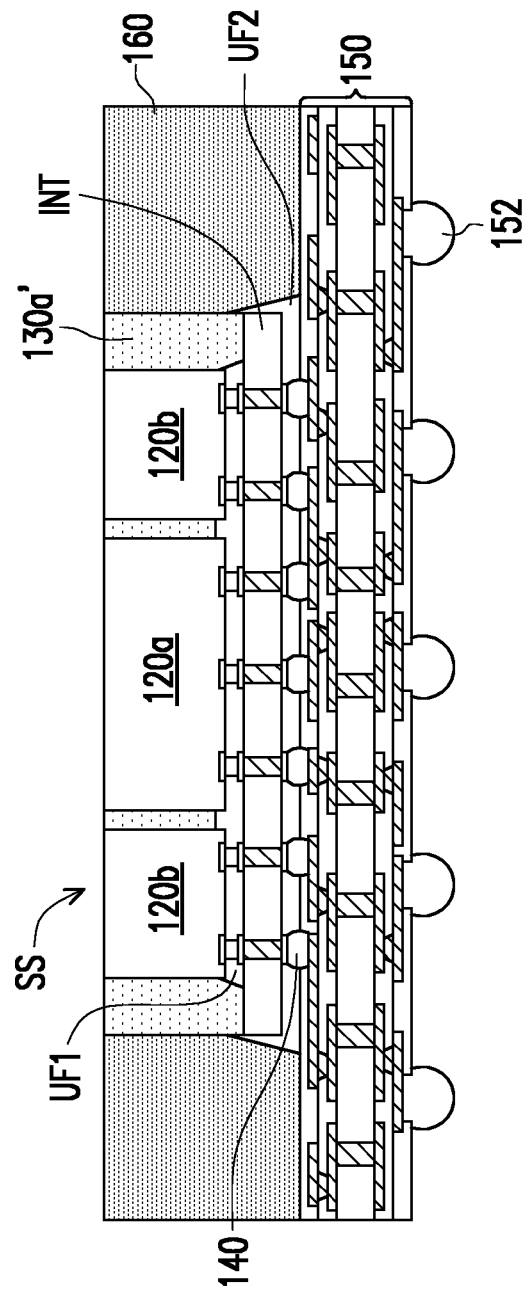

Referring to FIG. 6, an insulating material is formed over the wiring substrate 150 to cover the underfill UF2 and the singulated structure SS mounted on the wiring substrate 150. The insulating material may be formed by an over-molding process or a deposition process followed by a removal process. In some embodiments, an insulating material such as epoxy resin is formed on the interposer wafer W to cover the back surfaces and sidewalls of the singulated structure SS through an over-molding process, and a grinding process, a chemical mechanical polishing (CMP) process or other suitable removal process is then performed to remove portions of the epoxy resin until the back surfaces of the semiconductor dies 120a and 120b in the singulated structure SS are revealed. In some alternative embodiments, an insulating material such as tetraethoxysilane (TEOS) formed oxide is formed on the interposer wafer W to cover back surfaces and sidewalls of the singulated structure SS through a chemical vapor deposition (CVD) process, and a grinding process, a CMP process or other suitable removal process is then performed to remove portions of the TEOS formed oxide until the back surfaces of the semiconductor dies 120a and 120b in the singulated structure SS are revealed. After performing the above-mentioned removal process, an insulating encapsulation 160 is formed, and the top surface of the insulating encapsulation 160 is substantially leveled with the back surfaces of the semiconductor dies 120a and 120b in the singulated structure SS.

Furthermore, as illustrated in FIG. 6, the top surface of the insulating encapsulation 160 is substantially leveled with the top surface of the insulating encapsulation 130a' and the top surfaces of the semiconductor dies 120a and 120b, and sidewalls of the insulating encapsulation 160 are substantially aligned with sidewalls of the wiring substrate 150. In some alternative embodiments, the top surface of the insulating encapsulation 160 is substantially leveled with the top surface of the insulating encapsulation 130a' and the top surfaces of the semiconductor dies 120a and 120b, and sidewalls of the insulating encapsulation 160 keep a lateral distance from sidewalls of the wiring substrate 150.

Figure 7:
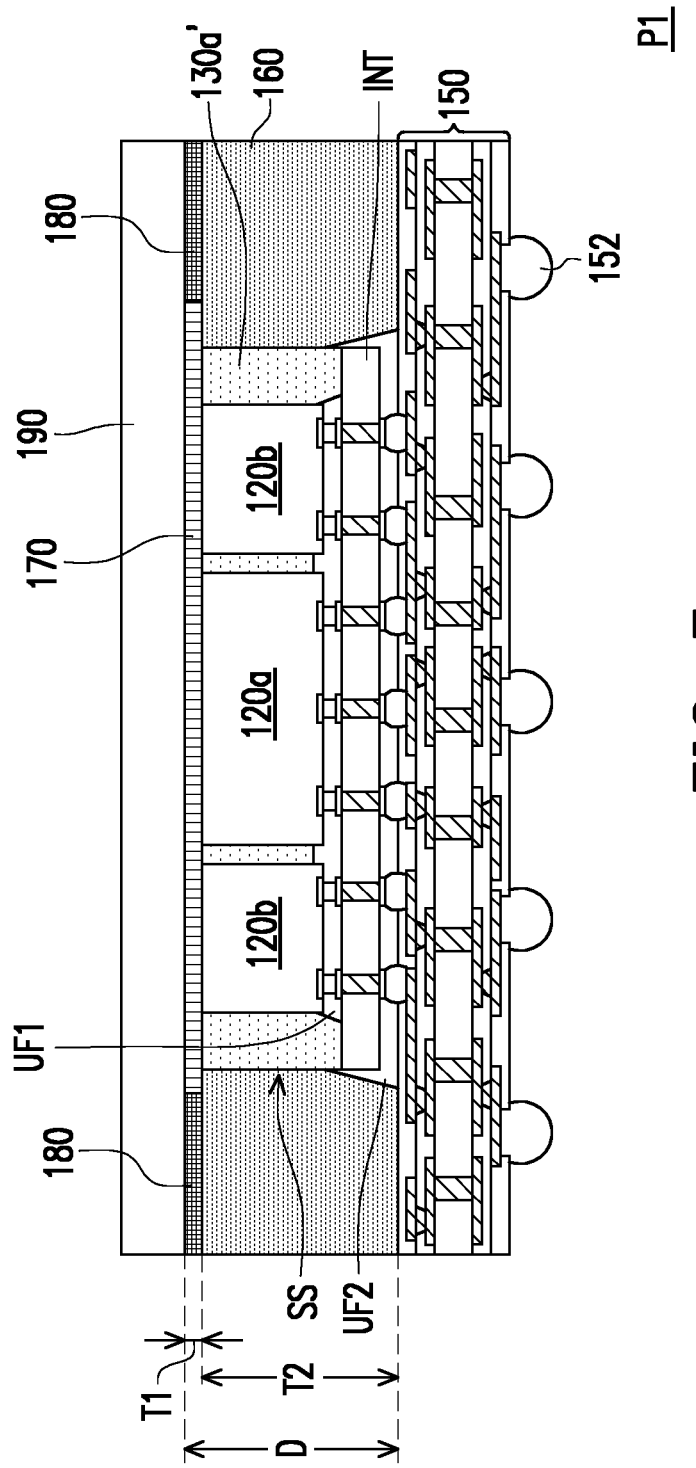

Referring to FIG. 7, after forming the insulating encapsulation 160, a thermal interface material (TIM) 170 and an adhesive 180 are applied to cover the singulated structure SS and the insulating encapsulation 160. The thermal interface material 170 may cover the top surface of the singulated structure SS and a portion of the top surface of the insulating encapsulation 160, and the adhesive 180 may cover the rest portion of the top surface of the insulating encapsulation 160. The material of the thermal interface material 170 may include metallic TIM, such as indium (In) sheet or film, indium foil, indium solder, silver (Ag) paste, silver alloy or combination thereof. The thermal interface material 170 may also be polymer-based TIM with thermal conductive fillers. Applicable thermal conductive filler materials may include aluminum oxide, boron nitride, aluminum nitride, aluminum, copper, silver, indium, a combination thereof, or the like. The thermal interface material 170 may include film-based or sheet-based material such as sheet with synthesized carbon nano-tube (CNT) structure integrated into the sheet, thermal conductive sheet with vertically oriented graphite fillers or the like, and the material of the adhesive 180 may include thermally conductive adhesive or epoxy-based adhesive or the like. A lid 190 is then provided over and attached to the thermal interface material 170 and the adhesive 180. The lid 190 is thermally coupled to the back surfaces of the semiconductor dies 120a and 120b in the singulated structure SS through the thermal interface material 170, and the lid 190 is adhered with the top surface of the insulating encapsulation 160 through the adhesive 180. The material of the lid 190 may include copper, aluminum, cobalt, copper coated with nickel, stainless steel, tungsten, silver diamond, aluminum silicon carbide or the like. Furthermore, the lid 190 may serve and function as a heat sink.

In some alternative embodiments, not illustrated in figures, the top surface of the singulated structure SS and the top surface of the insulating encapsulation 160 are covered by the thermal interface material 170, and formation of the adhesive 180 is omitted. In other words, the lid 190 is attached to the singulated structure SS and the insulating encapsulation 160 through the thermal interface material 170.

As illustrated in FIG. 7, after forming the lid 190, a Chip-on-Wafer-on-Substrate (CoWoS) package structure P1 is formed. The CoWoS package structure P1 includes a wiring substrate 150, an interposer INT disposed on and electrically connected to the wiring substrate 150, semiconductor dies 120a and 120b disposed on and electrically connected to the interposer INT, a first insulating encapsulation 130a' disposed on the interposer INT, a second insulating encapsulation 160 disposed on the wiring substrate 150, and a lid 190 is provided. The semiconductor dies 120a and 120b are laterally encapsulated by the first insulating encapsulation 130a'. The semiconductor dies 120a and 120b and the first insulating encapsulation 130a' are laterally encapsulated by the second insulating encapsulation 160. Sidewalls of the lid 190 are substantially aligned with sidewalls of the second insulating encapsulation 160 and sidewalls of the wiring substrate 150. The lid 190 is disposed on the semiconductor dies 120a and 120b, the first insulating encapsulation 130a' and the second insulating encapsulation 160. In some embodiments, the CoWoS package structure P1 further includes an adhesive 180 and a thermal interface material 170, wherein the adhesive is disposed between the second insulating encapsulation 160 and the lid 190, and the thermal interface material 170 is disposed between the semiconductor dies 120a and 120b and the lid 190. In some embodiments, a first top surface of the first insulating encapsulation 130a' is substantially leveled with a second top surface of the second insulating encapsulation 160. In some embodiments, the CoWoS package structure P1 further includes an underfill UF2 disposed between the interposer INT and the wiring substrate 150, wherein the underfill UF2 is laterally encapsulated by the second insulating encapsulation 160.

As illustrated in FIG. 7, the lid 190 may be a metallic plate with favorable thermal conductivity and structural strength. The minimum distance D between the lid 190 and the wiring substrate 150 is greater than the maximum thickness T1 of the second insulating encapsulation 160. In some embodiments, the minimum distance D between the lid 190 and the wiring substrate 150 substantially equals to a sum of the maximum thickness T1 of the second insulating encapsulation 160 and the thickness T2 of the thermal interface material 170. The minimum distance D between the lid 190 and the wiring substrate 150 may range from about 800 micrometers to about 1200 micrometers, the maximum thickness T2 of the second insulating encapsulation 160 may range from about 600 micrometers to about 900 micrometers, and the thickness T1 of the thermal interface material 170 may range from about 50 micrometers to about 300 micrometers.

Since the singulated structure SS is laterally encapsulated by the insulating encapsulation 160, warpage of the CoWoS package structure P1 is controlled. Furthermore, delamination issue of the adhesive 180 as well as crack issue of the conductive bumps 122a and 122b resulted from the warpage of the CoWoS package structure P1 may be minimized.

FIG. 8 through FIG. 12 are cross-sectional views schematically illustrating various package structures in accordance with some other embodiments of the present disclosure.

Figure 8:
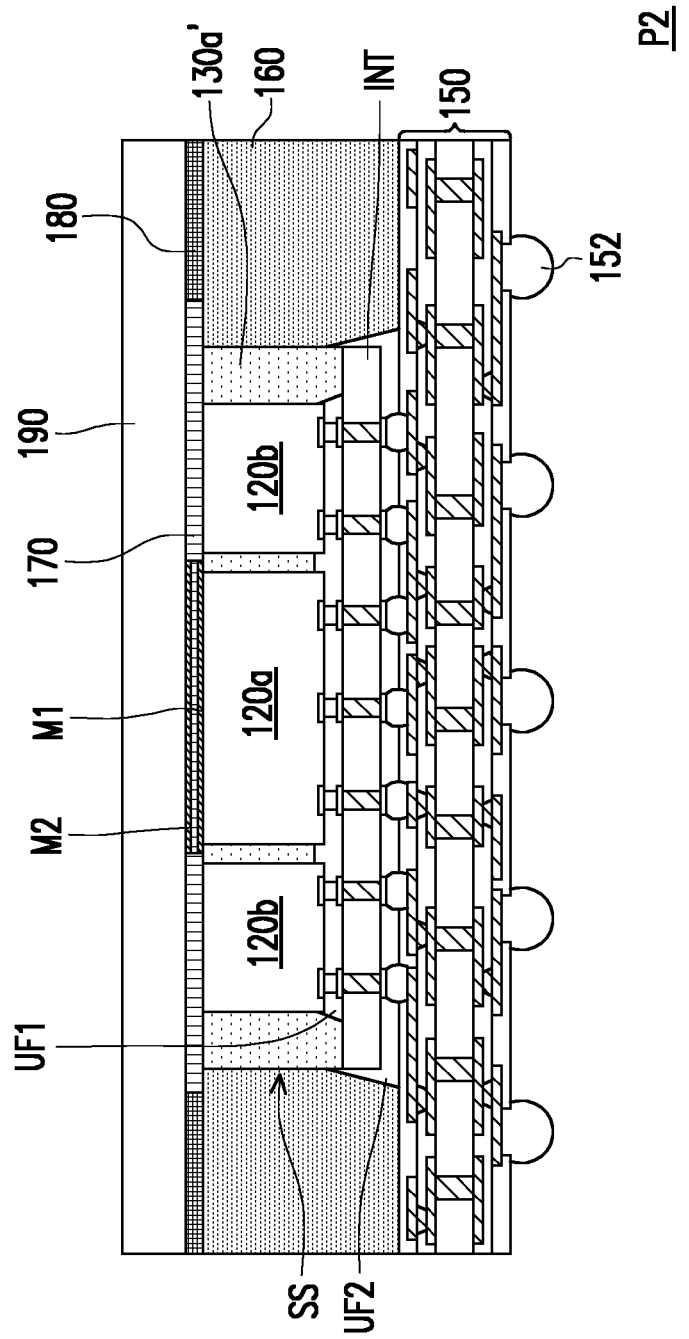
FIG. 8 through FIG. 12 are cross-sectional views schematically illustrating various package structures in accordance with some other embodiments of the present disclosure.

Referring to FIG. 7 and FIG. 8, the CoWoS package structure P2 illustrated in FIG. 8 is similar with the CoWoS package structure P1 illustrated in FIG. 7 except that the CoWoS package structure P2 further includes a first metallic layer M1 disposed between the thermal interface material 170 and the semiconductor die 120a and a second metallic layer M2 disposed between the thermal interface material 170 and the lid 190. In the present embodiment, the first metallic layer M1 covers the back surface of the semiconductor die 120 and portions of the insulating encapsulation 130a', the back surfaces of the semiconductor dies 120b and the top surface of the insulating encapsulation 130a are not covered by the first metallic layer M1. In the present embodiment, the second metallic layer M2 covers a portion of the thermal interface material 170 and is located right above the first metallic layer M1, the second metallic layer M2 does not cover the adhesive 180. For example, the material of the first metallic layer M1 and the second metallic layer M2 includes a conductive material or metal such as gold, indium, copper, silver, titanium gold alloy, lead, tin, nickel vanadium or combination thereof.

The coverage of the first metallic layer M1 and the second metallic layer M2 may be modified in accordance with design requirements. In accordance with design requirements, the first metallic layer M1 may not only cover the back surface of the semiconductor die 120a but also cover the back surfaces of the semiconductor dies 120b.

Figure 9:
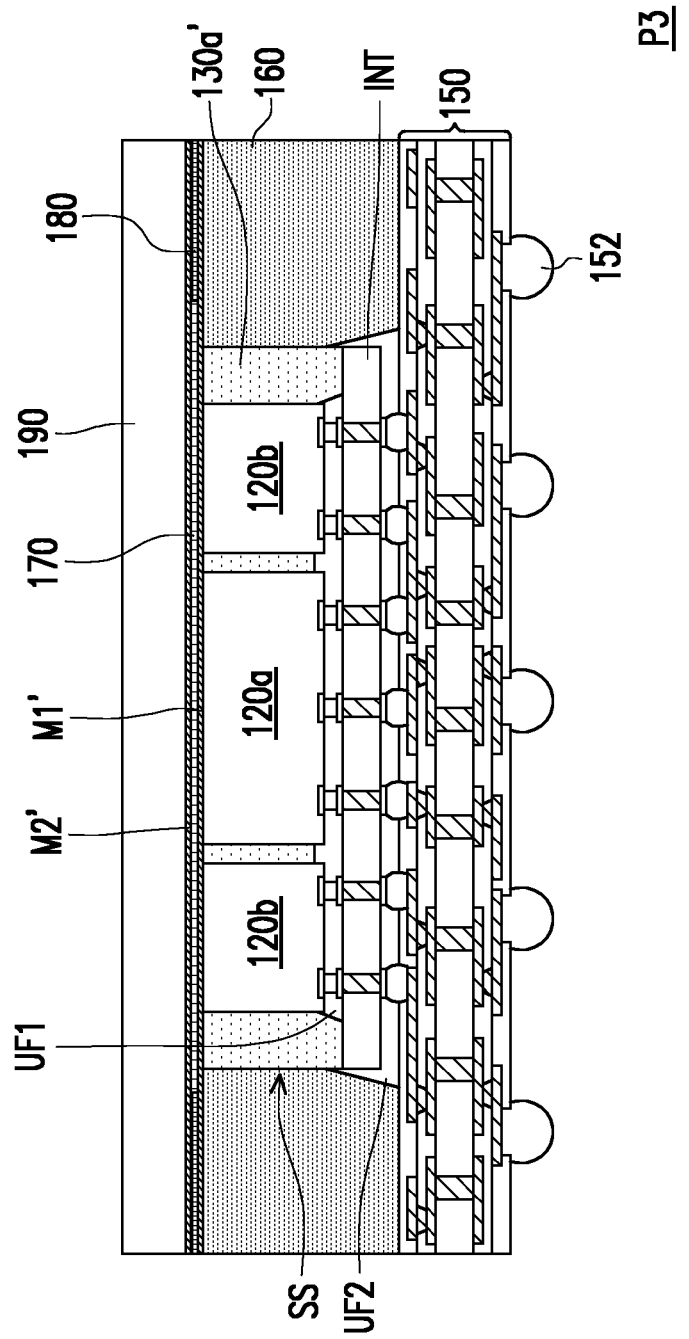

Referring to FIG. 7 and FIG. 9, the CoWoS package structure P3 illustrated in FIG. 8 is similar with the CoWoS package structure P1 illustrated in FIG. 7 except that the CoWoS package structure P3 further includes a first metallic layer M1' disposed between the thermal interface material 170 and the semiconductor die 120a and a second metallic layer M2' disposed between the thermal interface material 170 and the lid 190. In the present embodiment, the first metallic layer M1' entirely covers the back surfaces of the top surface of the insulating encapsulation 130a', the top surface of the insulating encapsulation 160 and the semiconductor dies 120 and 120b. In the present embodiment, the second metallic layer M2' entirely covers the top surface of the thermal interface material 170 and the top surface of the adhesive 180. In other words, the thermal interface material 170 and the adhesive 180 are spaced apart from the singulated structure SS and the insulating encapsulation 160 by the first metallic layer M1', while the thermal interface material 170 and the adhesive 180 are spaced apart from the lid 190 by the second metallic layer M2'. For example, the material of the first metallic layer M1' and the second metallic layer M2' includes a conductive material or metal such as gold, indium, copper, silver, titanium gold alloy, lead, tin, nickel vanadium or combination thereof.

The above-mentioned metallic layers M1, M2, M1' and M2' may further enhance heat dissipation performance of the CoWoS package structure P2 and P3.

Figure 10:
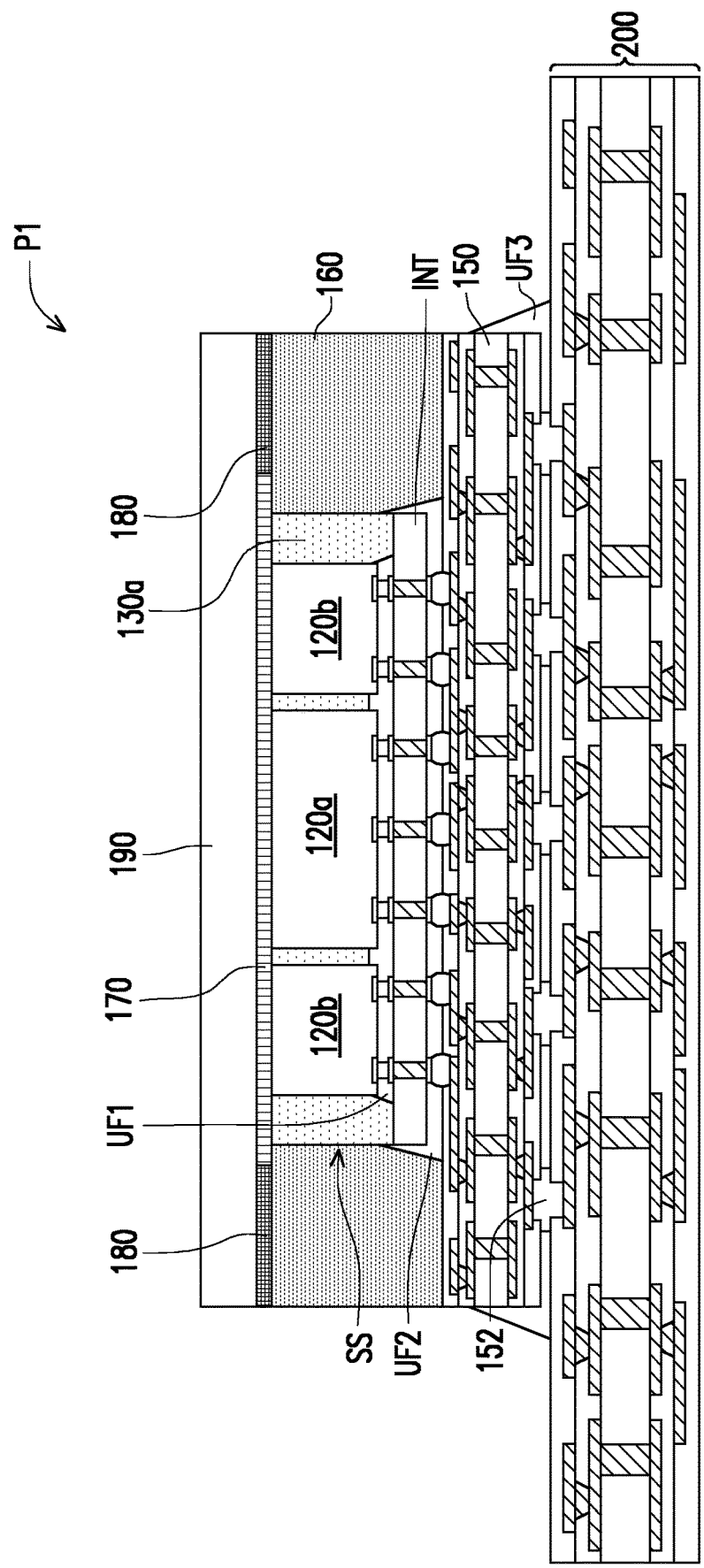

Referring to FIG. 10, a package structure including the CoWoS package structure P1, an underfill UF3 and a circuit board 200 (e.g., a printed circuit board) is illustrated. The CoWoS package structure P1 is disposed on and electrically connected to the circuit board 200 through the conductive terminals 152. The underfill UF3 fills a gap between the CoWoS package structure P1 and the circuit board 200 to encapsulate the conductive terminals 152. The conductive terminals 152 are laterally encapsulated and protected by the underfills UF3 such that damage of the conductive terminals 152 resulted from Coefficient of Thermal Expansion (CTE) mismatch between the CoWoS package structure P1 and the circuit board 200 may be prevented. Accordingly, reliability of the conductive terminals 152 may be improved.

In some embodiments, the underfill UF3 not only fills the gap between the CoWoS package structure P1 and the circuit board 200, but also covers sidewalls of the CoWoS package structure P1. As illustrated in FIG. 10, the underfill UF3 not only fills the gap between CoWoS package structure P1 and the circuit board 200, but also covers sidewalls of the wiring substrate 150.

Although FIG. 10 illustrates that the CoWoS package structure P1 is mounted on the circuit board, the present embodiment is not limited thereto. Other type of CoWoS package structure, such as CoWoS package structure P2 illustrated in FIG. 8 or CoWoS package structure P3 illustrated in FIG. 9, can be mounted onto the circuit board 200.

Figure 11:
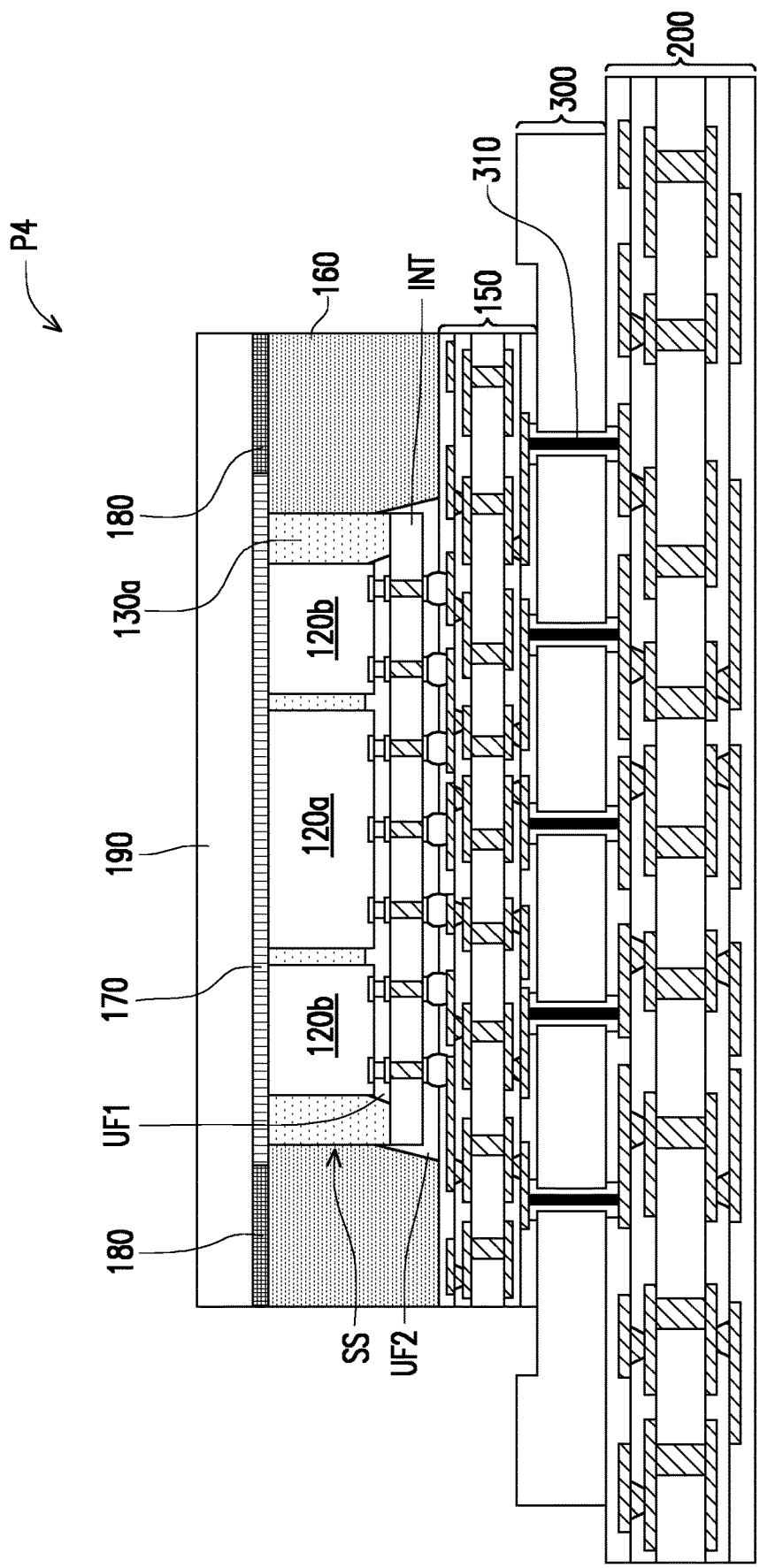

Referring to FIG. 11, a package structure including a CoWoS package structure P4, a circuit board 200 (e.g., a printed circuit board) and a socket board 300 disposed between the wiring substrate 150 of the CoWoS package structure P4 and the circuit board 200 is illustrated, wherein the wiring substrate 150 of the CoWoS package structure P4 is electrically connected to the circuit board 200 through the socket board 300. Furthermore, the package structure illustrated in figure does not include an underfill located between the circuit board 200 and the socket board 300.

As illustrated in FIG. 11, the CoWoS package structure P4 is modified from the CoWoS package structure P1 illustrated in FIG. 7. The CoWoS package structure P4 is similar to the CoWoS package structure P1 except that the CoWoS package structure P4 does not include conductive terminals 152 (i.e. conductive terminals 152 illustrated in FIG. 7). The socket board 300 includes multiple conductive pins 310 in contact with wirings in the wiring substrate 150 and the circuit board 200. In some embodiments, the socket board 300 includes pogo pins arranged in array, wherein the pogo pins are in contact with and electrically connected to wirings in the wiring substrate 150 and the circuit board 200.

Although FIG. 11 illustrates that the CoWoS package structure P4 is mounted on the circuit board, the present embodiment is not limited thereto. Other type of CoWoS package structure can be mounted onto the circuit board 200 through the socket board 300. In some other embodiment, a CoWoS package structure which is modified from the CoWoS package structure P2 illustrated in FIG. 8 may be mounted onto the circuit board 200 through the socket board 300, and the CoWoS package structure which is modified from the CoWoS package structure P2 does not include conductive terminals (i.e. conductive terminals 152 illustrated in FIG. 8). In some alternative embodiment, a CoWoS package structure which is modified from the CoWoS package structure P3 illustrated in FIG. 9 may be mounted onto the circuit board 200 through the socket board 300, and the CoWoS package structure which is modified from the CoWoS package structure P3 does not include conductive terminals (i.e. conductive terminals 152 illustrated in FIG. 9).

Figure 12:
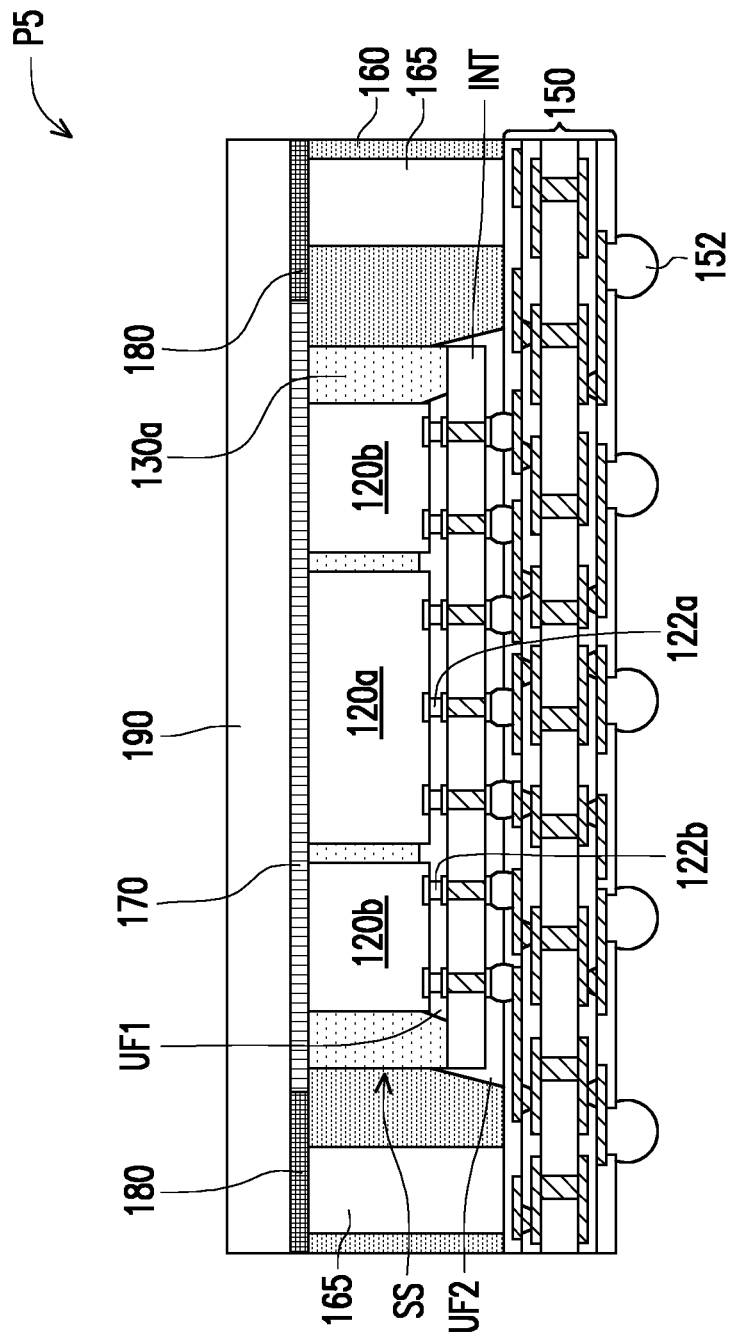

Referring to FIG. 7 and FIG. 12, the CoWoS package structure P5 illustrated in FIG. 12 is similar with the CoWoS package structure P1 illustrated in FIG. 7 except that the CoWoS package structure P5 further includes a reinforcement structure 165 embedded in the insulating encapsulation 160. The reinforcement structure 165 is disposed on the wiring substrate 150 and surrounds the singulated structure SS. The reinforcement structure 165 is spaced apart from the singulated structure SS by the insulating encapsulation 160. The reinforcement structure 165 is in contact with and covered by the adhesive 180. Furthermore, the thickness of the reinforcement structure 165 is substantially equal to the thickness (i.e. the thickness T2 illustrated in FIG. 7) of the insulating encapsulation 160.

FIG. 13A through FIG. 13G are top views schematically illustrating various reinforcement structures in accordance with some other embodiments of the present disclosure.

Figure 13B:
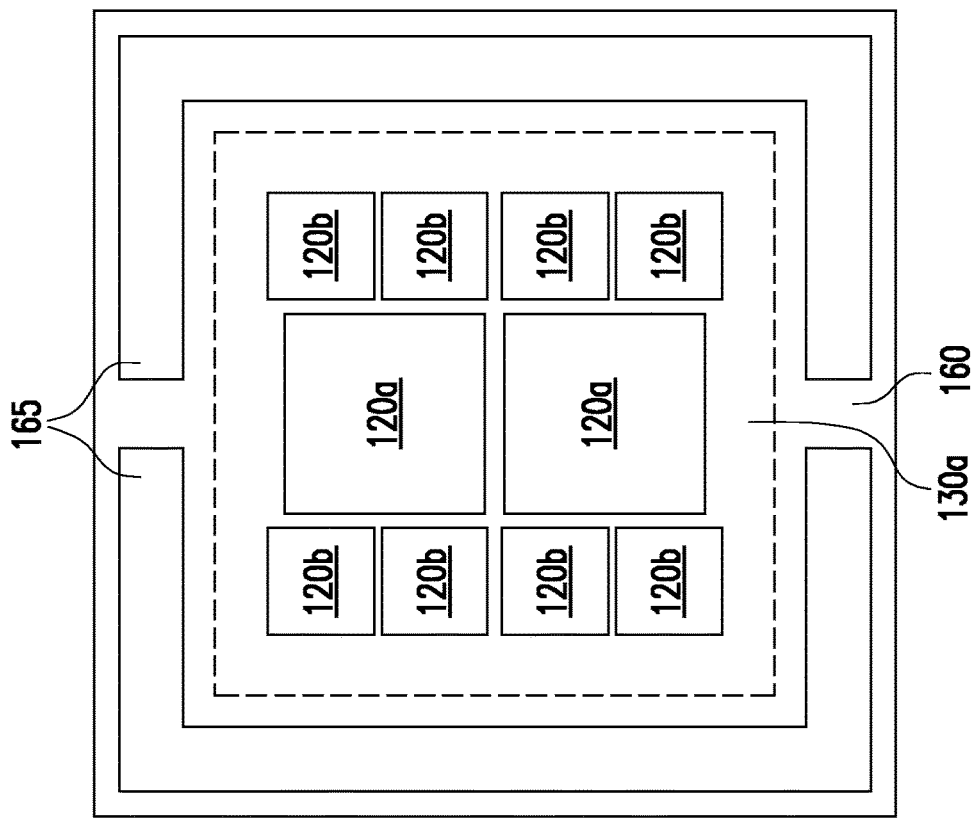
Figure 13A:
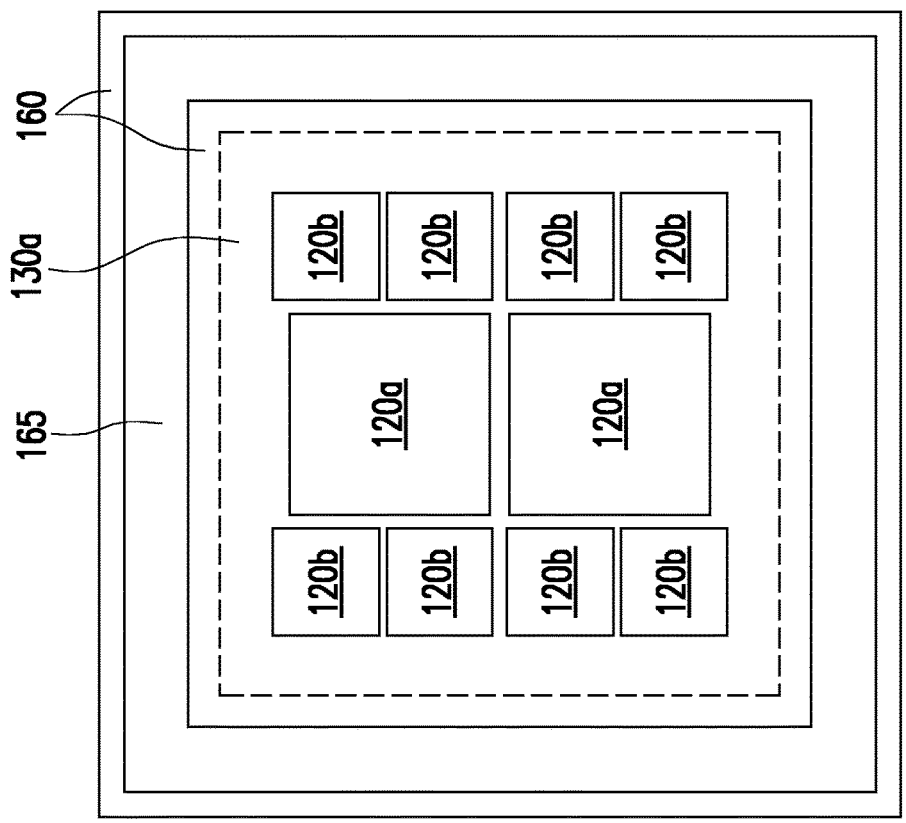
Figure 13D:
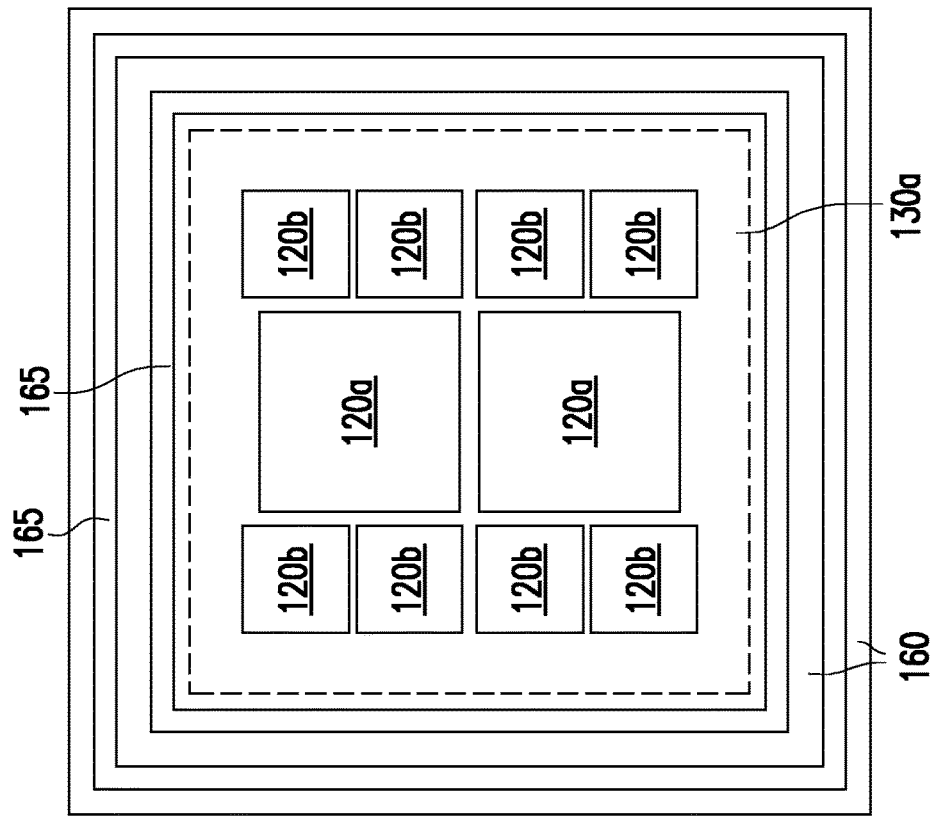
Figure 13C:
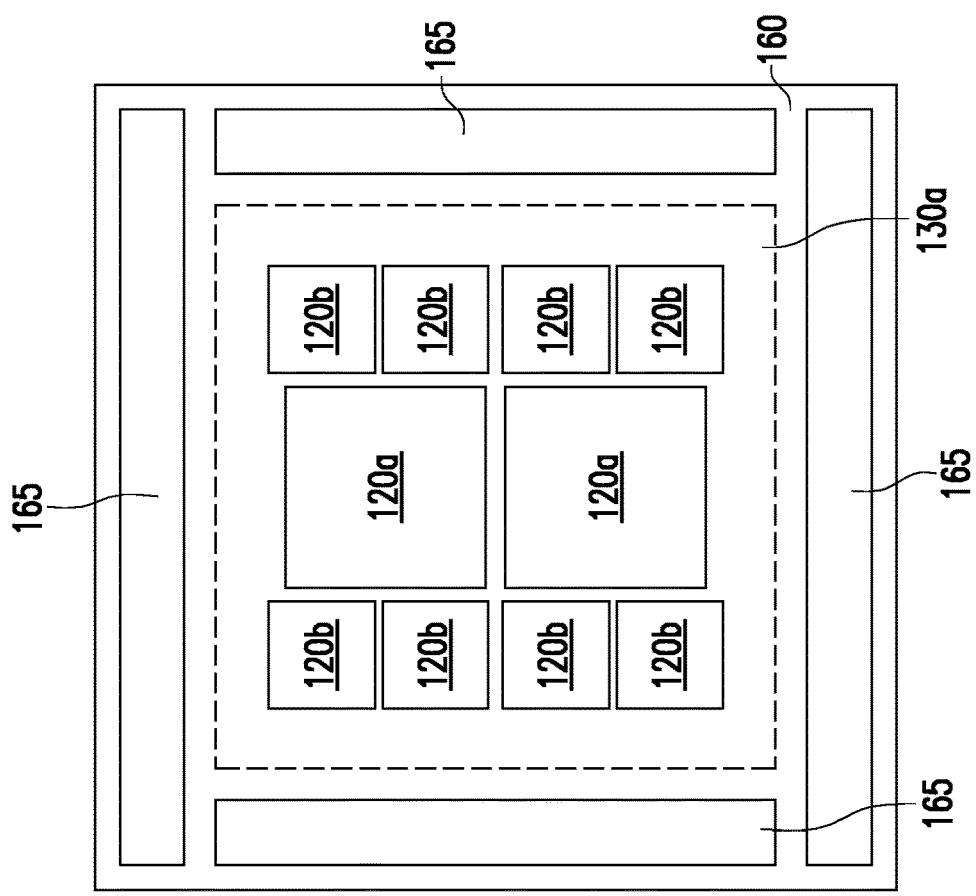
Figure 13G:
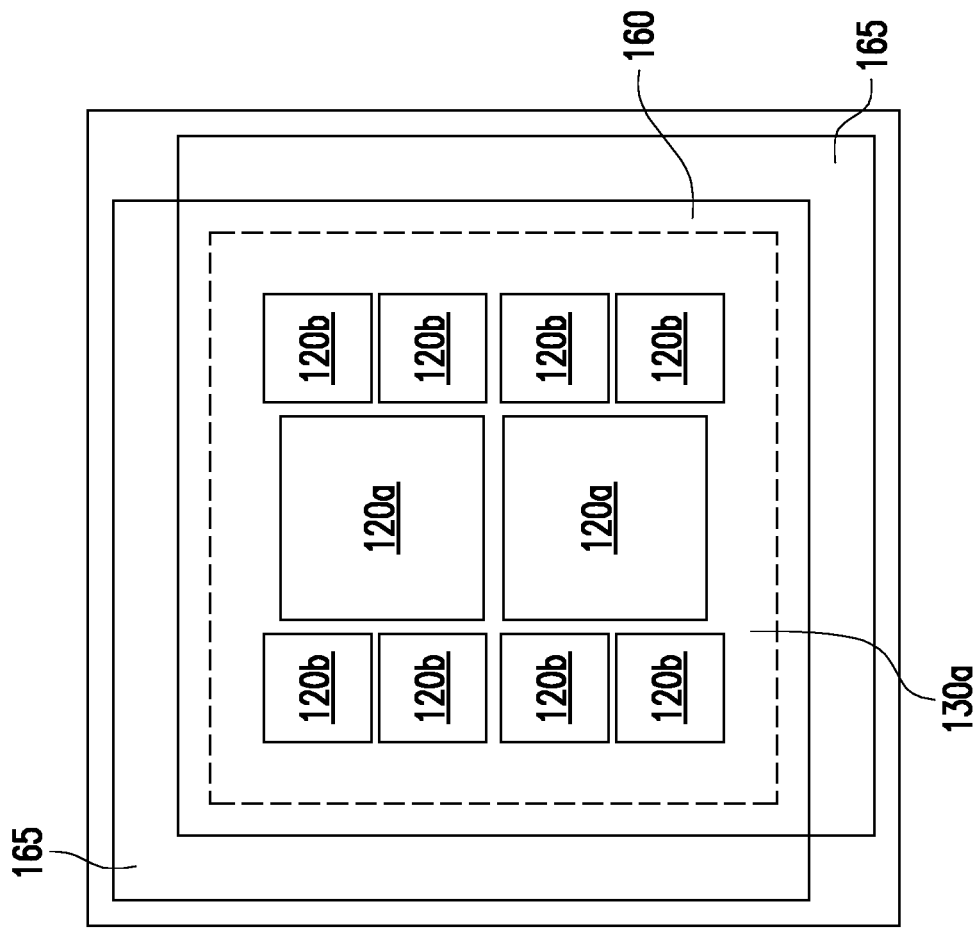

Referring to FIG. 13A through FIG. 13G, various reinforcement structures 165 are illustrated. In some embodiments, as illustrated in FIG. 13A, the reinforcement structure 165 includes a single ring-shaped pattern, and the semiconductor dies 120a and 120b are surrounded by the single ring-shaped pattern. In some other embodiments, as illustrated in FIG. 13B, the reinforcement structure 165 includes a pair of C-shaped patterns, and the semiconductor dies 120a and 120b are surrounded by the pair of C-shaped patterns. In some alternative embodiments, as illustrated in FIG. 13C, the reinforcement structure 165 includes a group of bar-shaped patterns including a pair of horizontal bar-shaped patterns and a pair of vertical bar-shaped patterns, and the semiconductor dies 120a and 120b are surrounded by the group of bar-shaped patterns. In some embodiments, as illustrated in FIG. 13D, the reinforcement structure 165 includes an inner ring-shaped pattern and an outer ring-shaped pattern surrounding the inner ring-shaped pattern, and the semiconductor dies 120a and 120b are surrounded by the inner ring-shaped pattern and the outer ring-shaped pattern. In some other embodiments, as illustrated in FIG. 13E, the reinforcement structure 165 includes a pair of vertical bar-shaped patterns, and the semiconductor dies 120a and 120b are located between the pair of vertical bar-shaped patterns. In some alternative embodiments, as illustrated in FIG. 13F, the reinforcement structure 165 includes a pair of horizontal bar-shaped patterns, and the semiconductor dies 120a and 120b are located between the pair of horizontal bar-shaped patterns. In some alternative embodiments, as illustrated in FIG. 13G, the reinforcement structure 165 includes a pair of L-shaped patterns, and the semiconductor dies 120a and 120b are located between the pair of L-shaped patterns.

The shape, distribution and the dimension of the reinforcement structure 165 is not limited in the present disclosure. Other types of reinforcement structures which are not illustrated in FIG. 13A through FIG. 13G may be applied as well.

Figure 14:
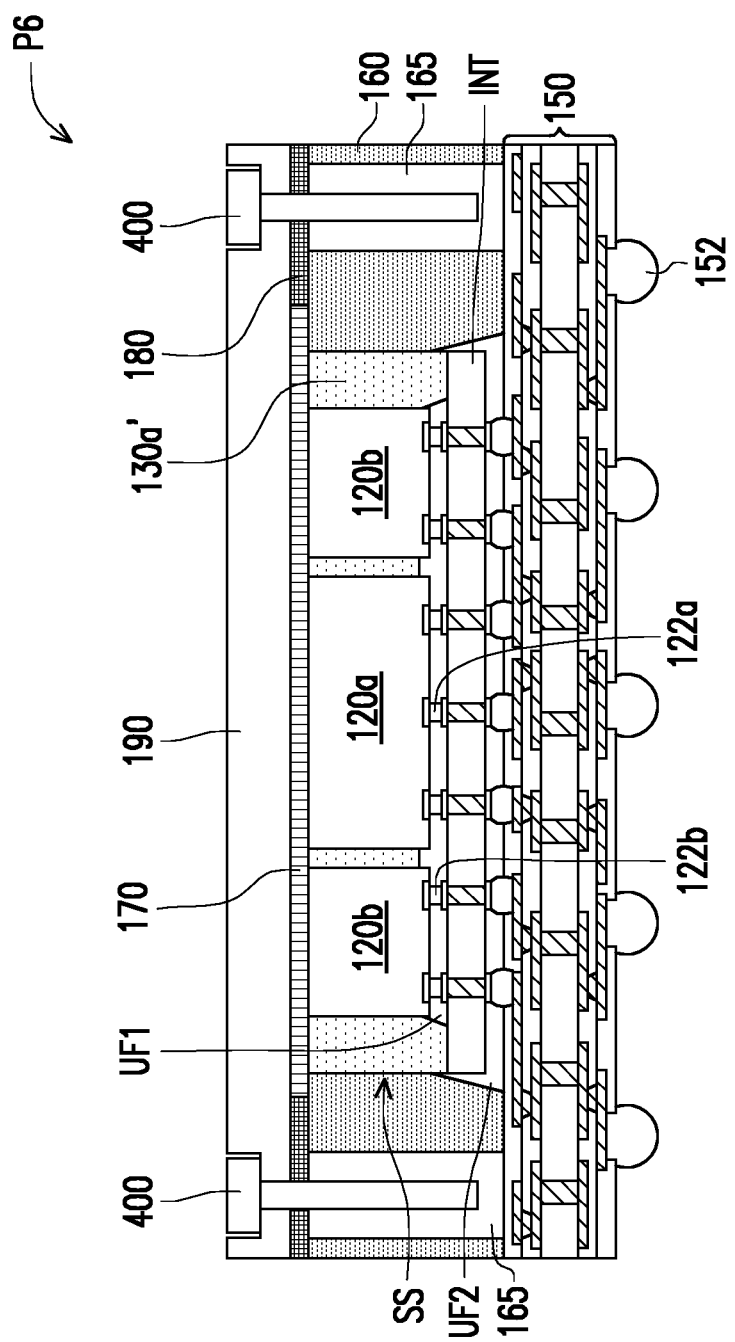
FIG. 14 and FIG. 15 are cross-sectional views schematically illustrating various package structures in accordance with some alternative embodiments of the present disclosure.
Figure 15:
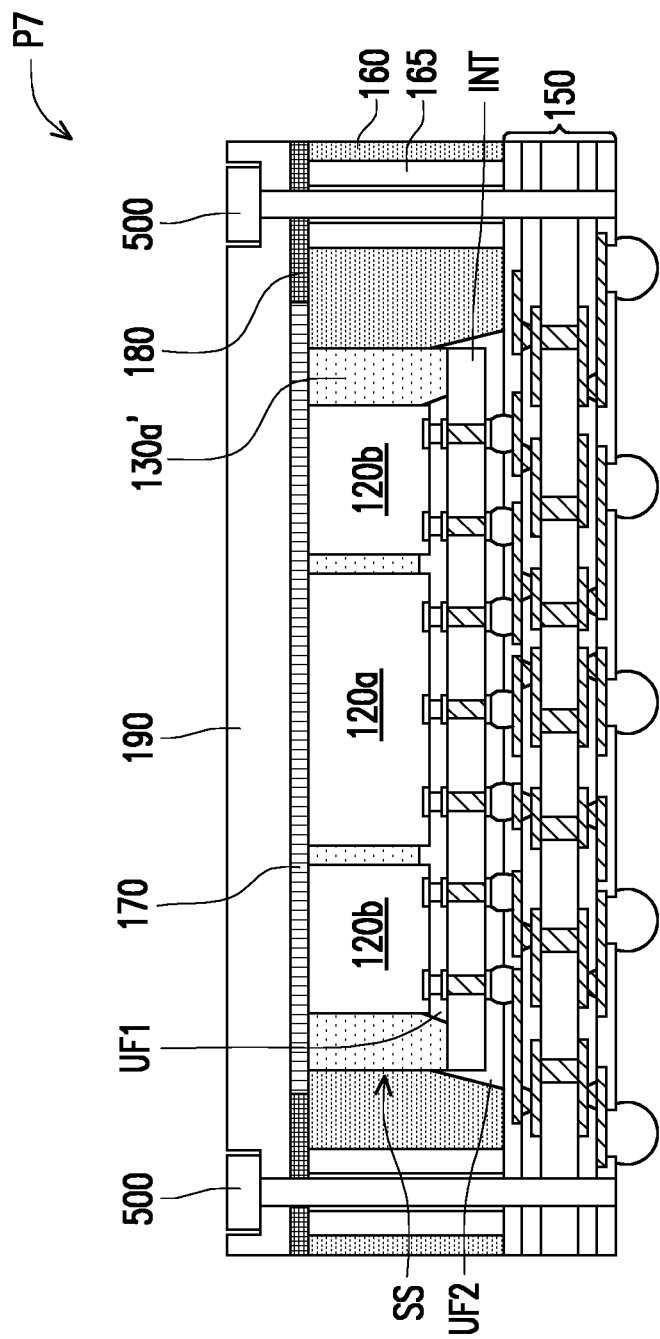

FIG. 14 and FIG. 15 are cross-sectional views schematically illustrating various package structures in accordance with some alternative embodiments of the present disclosure.

Referring to FIG. 12 and FIG. 14, the package structure P6 illustrated in FIG. 14 is similar to the package structure P5 illustrated in FIG. 12 except that the package structure P6 further includes screws 400 penetrating through the lid 190 and the adhesive 180, wherein the lid 190 is fastened to the reinforcement structure 165 through screws 400.

Referring to FIG. 15, the package structure P6 illustrated in FIG. 14 is similar to the package structure P5 illustrated in FIG. 12 except that the package structure P6 further includes screws 500 penetrating through the lid 190, the adhesive 180 and the reinforcement structure 165, wherein lid 190 is fastened to the reinforcement structure 165 and the wiring substrate 150 through screws 500.

FIG. 16A through FIG. 16E are top views schematically illustrating various reinforcement structures in accordance with some other embodiments of the present disclosure.

Figure 16B:
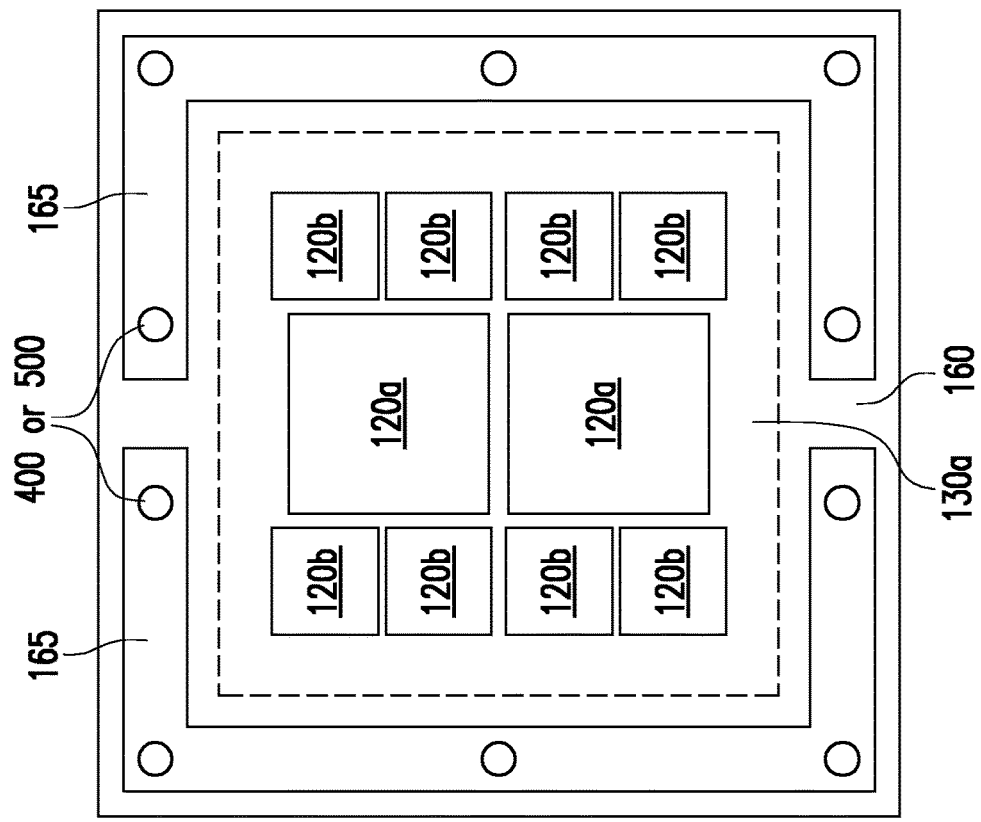
FIGS. 16A through FIG. 16E are top views schematically illustrating various reinforcement structures in accordance with some other embodiments of the present disclosure.
Figure 16A:
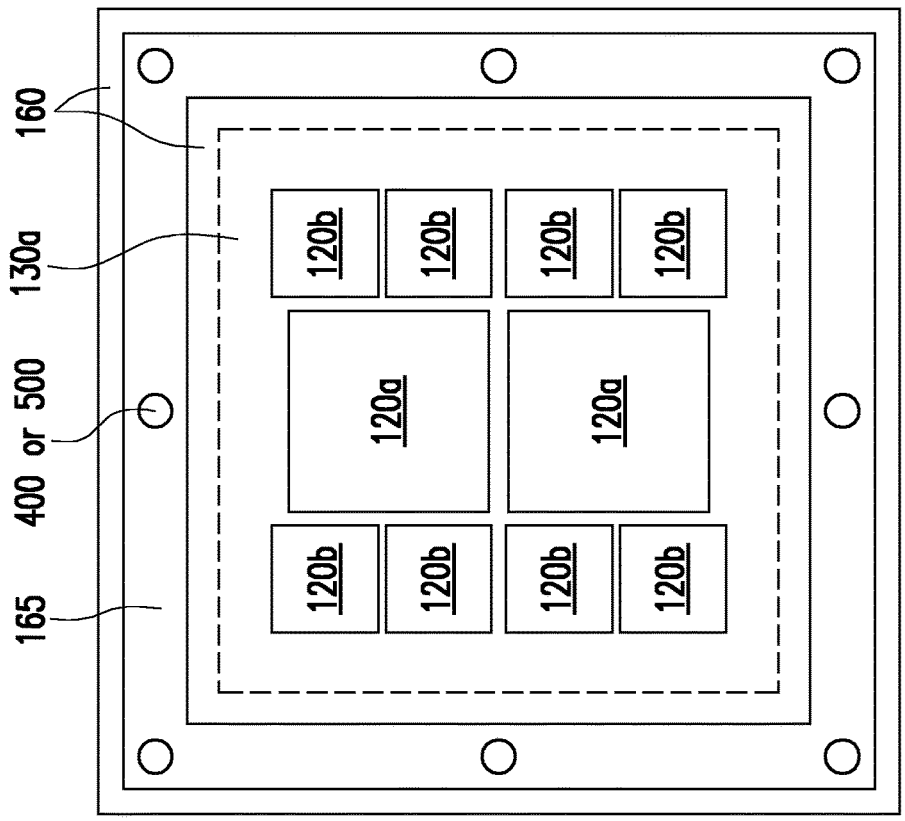
Figure 16C:
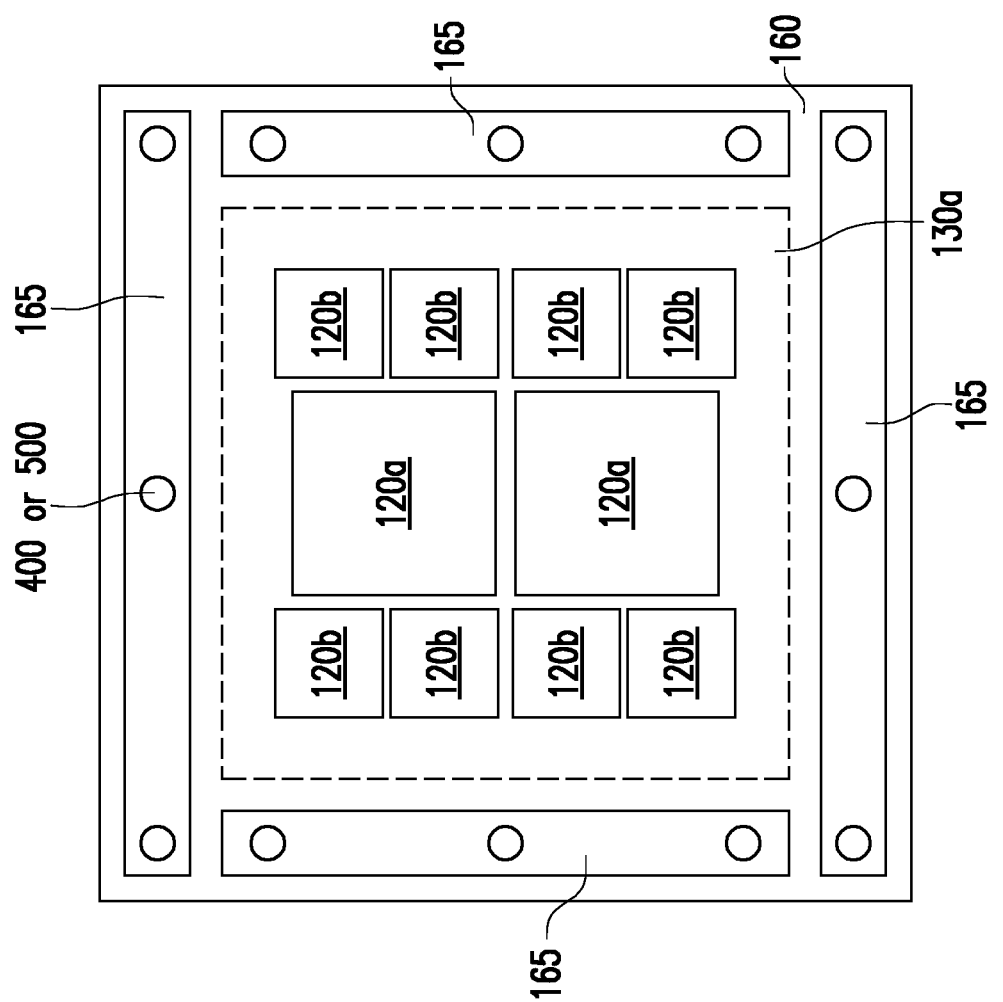
Figure 16E:
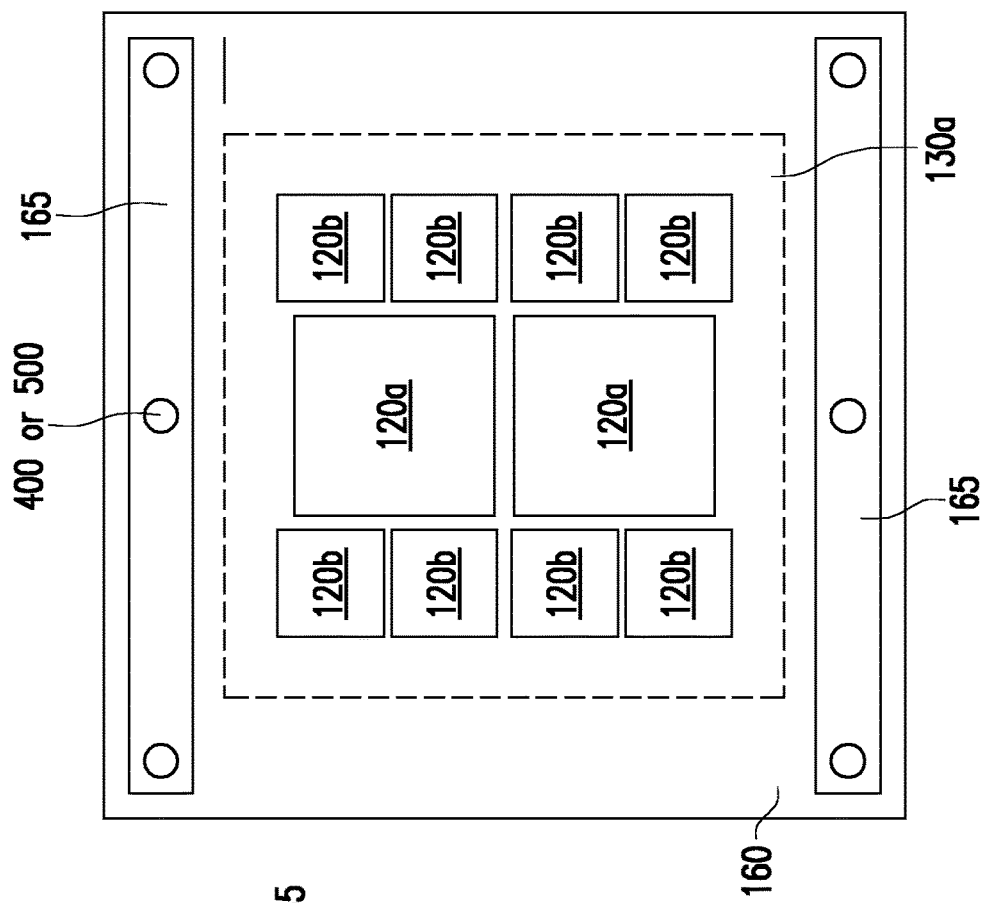
Figure 16D:
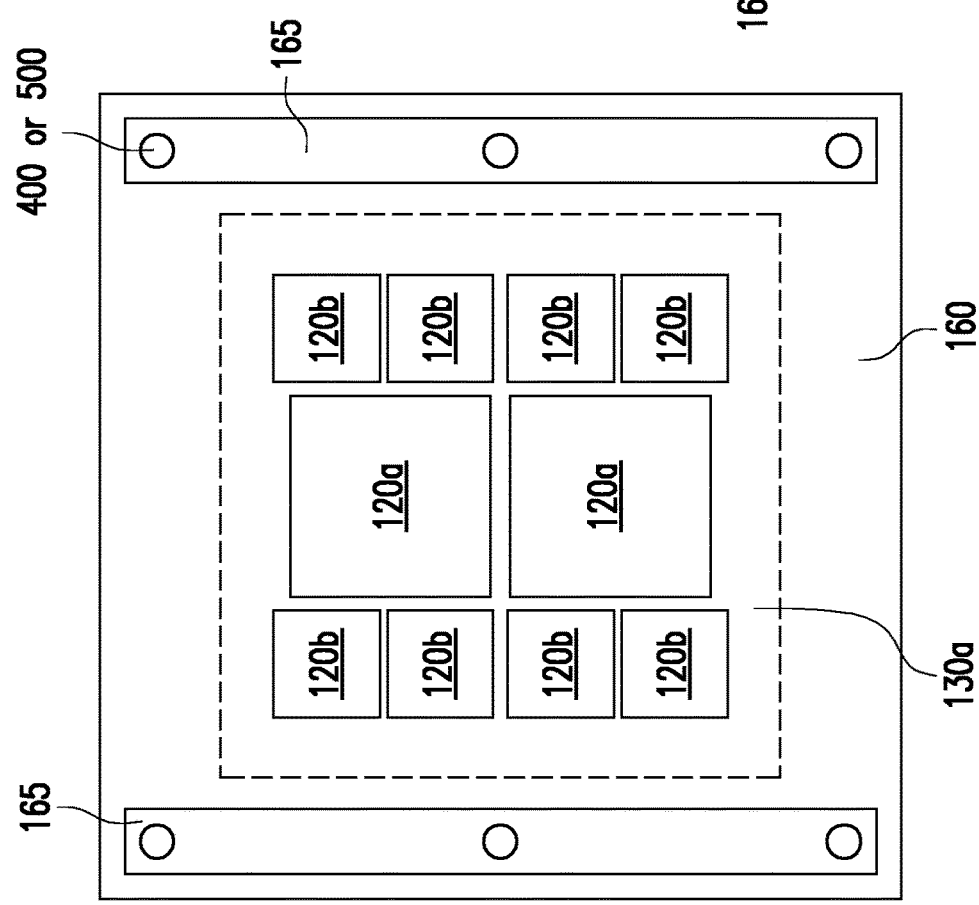

Referring to FIG. 16A through FIG. 16E, various reinforcement structures 165 fastened by screws 400 or 500 are illustrated. In some embodiments, as illustrated in FIG. 16A, the reinforcement structure 165 includes a single ring-shaped pattern fastened by screws 400 or 500, and the semiconductor dies 120a and 120b are surrounded by the single ring-shaped pattern. In some other embodiments, as illustrated in FIG. 16B, the reinforcement structure 165 includes a pair of C-shaped patterns fastened by screws 400 or 500, and the semiconductor dies 120a and 120b are surrounded by the pair of C-shaped patterns. In some alternative embodiments, as illustrated in FIG. 16C, the reinforcement structure 165 includes a group of bar-shaped patterns including a pair of horizontal bar-shaped patterns and a pair of vertical bar-shaped patterns, and the semiconductor dies 120a and 120b are surrounded by the group of bar-shaped patterns. In some other embodiments, as illustrated in FIG. 16D, the reinforcement structure 165 includes a pair of vertical bar-shaped patterns fastened by screws 400 or 500, and the semiconductor dies 120a and 120b are located between the pair of vertical bar-shaped patterns. In some alternative embodiments, as illustrated in FIG. 16E, the reinforcement structure 165 includes a pair of horizontal bar-shaped patterns fastened by screws 400 or 500, and the semiconductor dies 120a and 120b are located between the pair of horizontal bar-shaped patterns.

The shape, distribution and the dimension of the reinforcement structure 165 is not limited in the present disclosure. Other types of reinforcement structures which are not illustrated in FIG. 16A through FIG. 16E may be applied as well.

FIG. 17 through FIG. 21 are cross-sectional views schematically illustrating various package structures in accordance with some other embodiments of the present disclosure.

Figure 17:
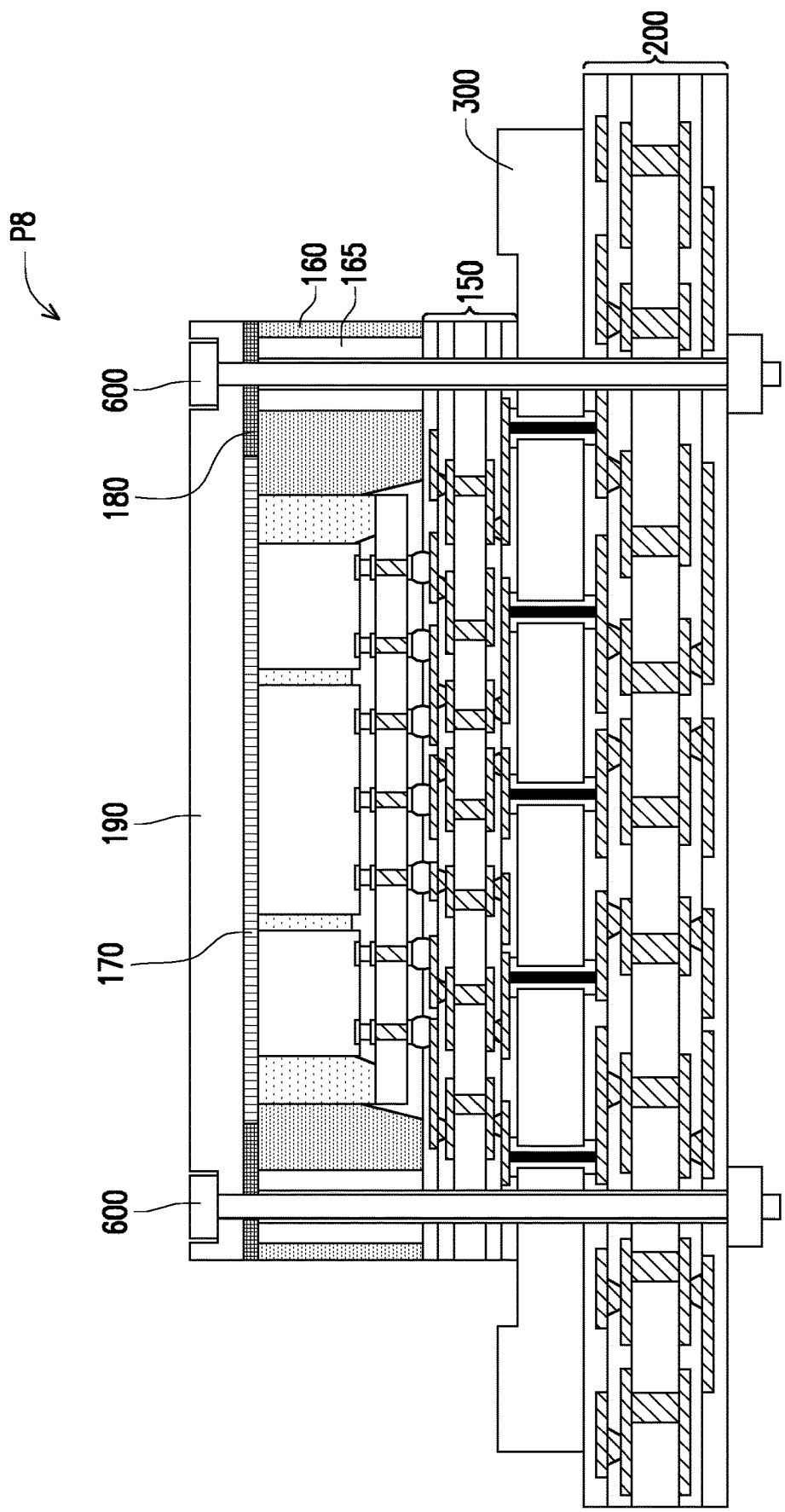
FIG. 17 through FIG. 21 are cross-sectional views schematically illustrating various package structures in accordance with some other embodiments of the present disclosure.

Referring to FIG. 17, the package structure P8 illustrated in FIG. 17 is similar to the package structure P4 illustrated in FIG. 11 except that the package structure P8 further includes a reinforcement structure 165 embedded in the insulating encapsulation 160 and screws 600 penetrating through the lid 190, the adhesive 180, the reinforcement structure 165, the wiring substrate 150, the socket board 300 and the circuit board 200.

Figure 18:
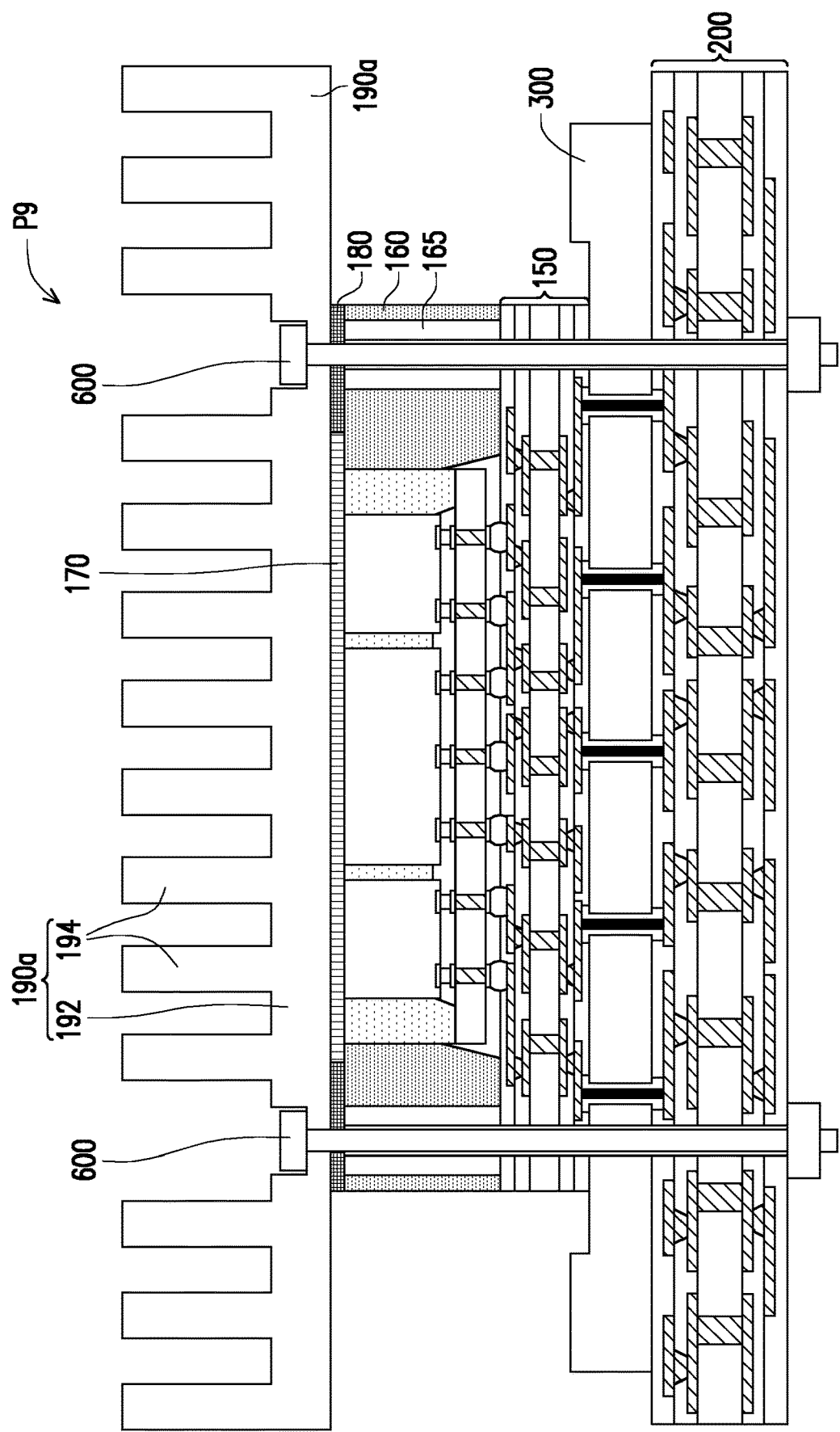

Referring to FIG. 18, the package structure P9 illustrated in FIG. 18 is similar to the package structure P8 illustrated in FIG. 17 except that the package structure P9 includes a lid 190a having enhanced heat dissipation performance. The lid 190a may serve and function as a heat sink. The lid 190a may include base plate 192 and multiple heat dissipation fins 194 protruding upwardly from the base plate 192.

Figure 19:
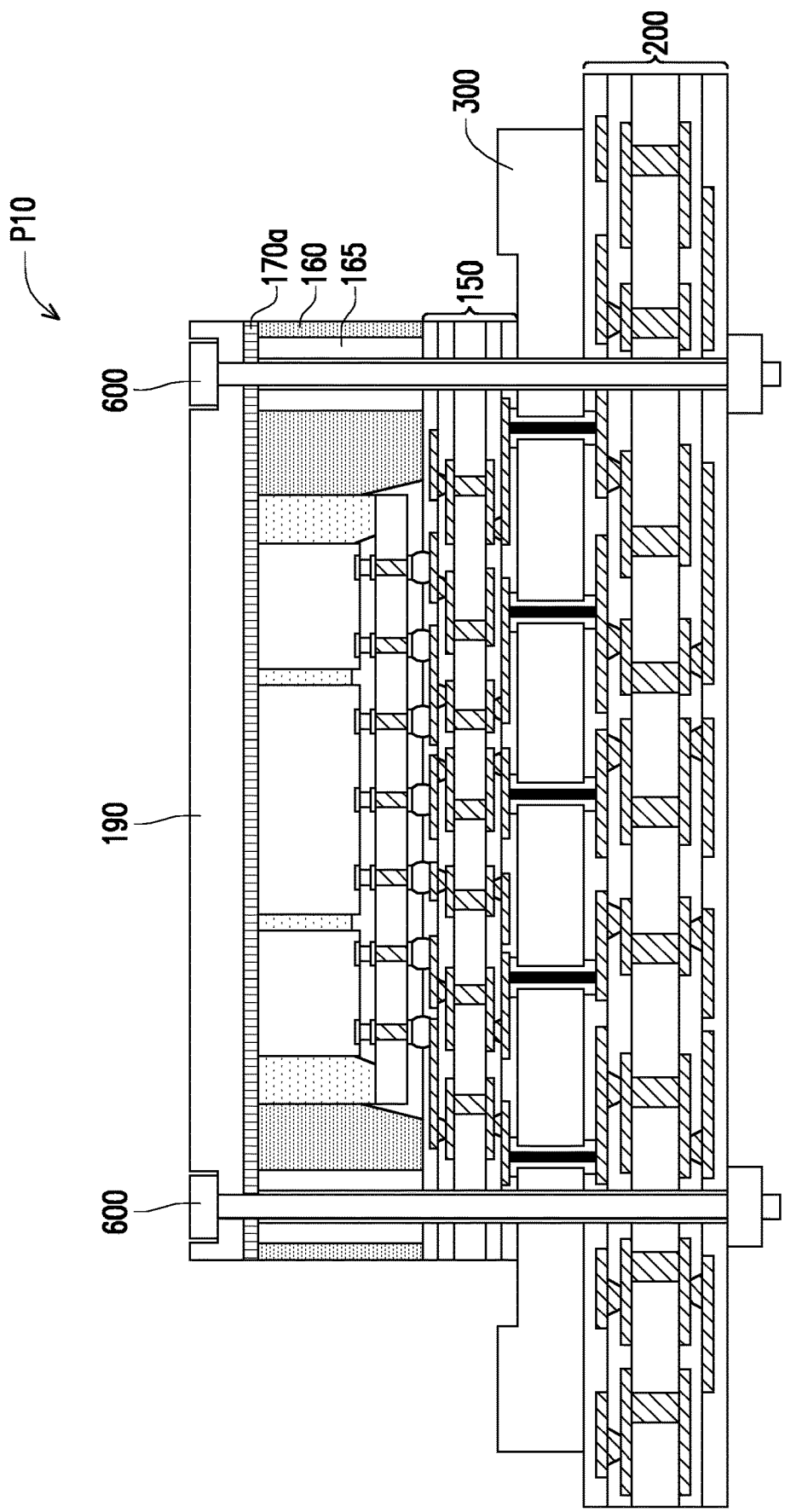

Referring to FIG. 19, the package structure P10 illustrated in FIG. 19 is similar to the package structure P8 illustrated in FIG. 17 except that the lid 190 is attached to the insulating encapsulation 160, the reinforcement structure 165 and the singulated structure SS through the thermal interface material 170a. In other words, the top surface of the singulated structure SS and the top surface of the insulating encapsulation 160 are entirely covered by the thermal interface material 170, and formation of the adhesive 180 illustrated in FIG. 17 is omitted.

Figure 20:
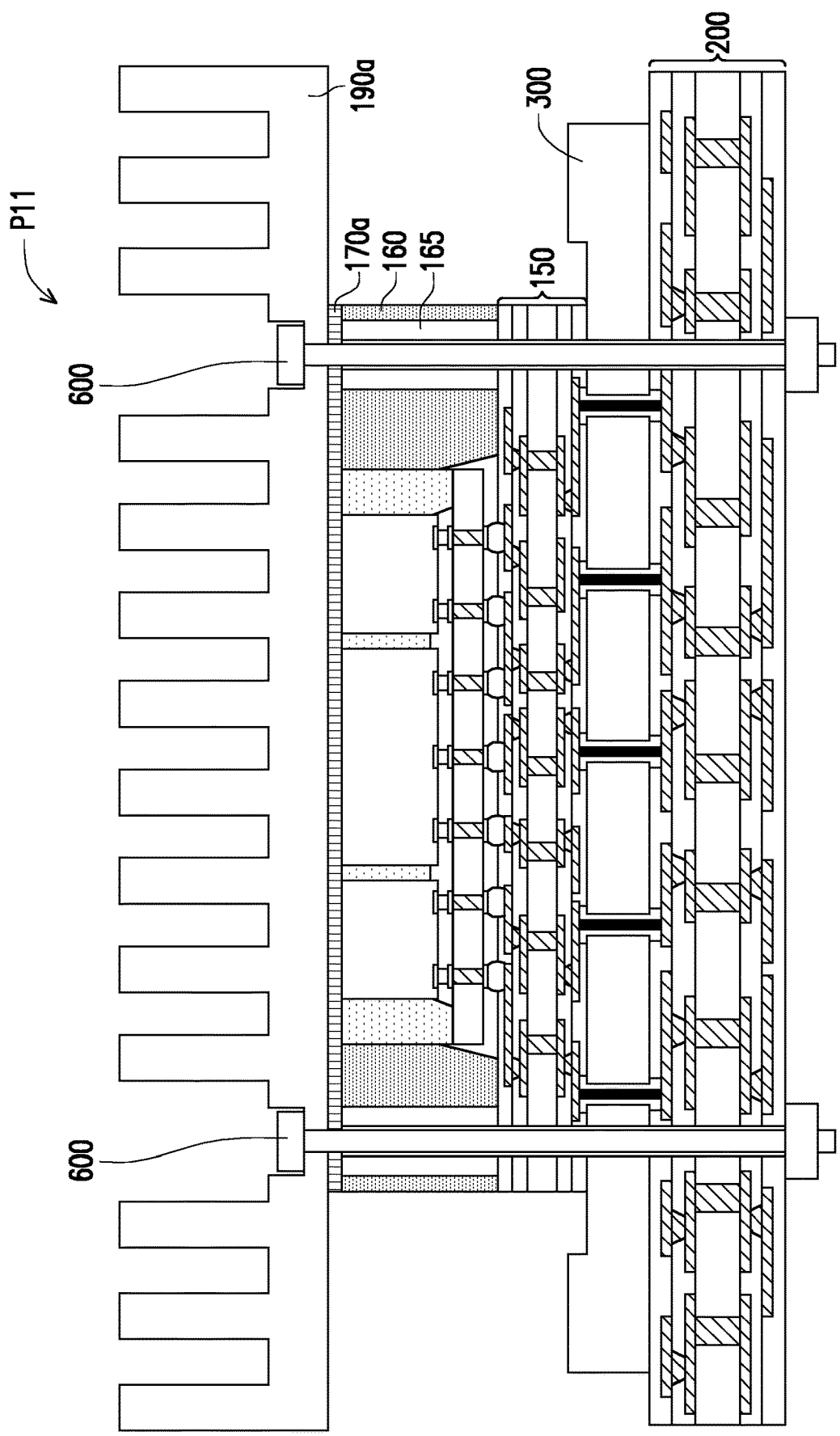

Referring to FIG. 20, the package structure P11 illustrated in FIG. 20 is similar to the package structure P9 illustrated in FIG. 18 except that the lid 190a is attached to the insulating encapsulation 160, the reinforcement structure 165 and the singulated structure SS through the thermal interface material 170a. In other words, the top surface of the singulated structure SS and the top surface of the insulating encapsulation 160 are entirely covered by the thermal interface material 170, and formation of the adhesive 180 illustrated in FIG. 18 is omitted.

Figure 21:
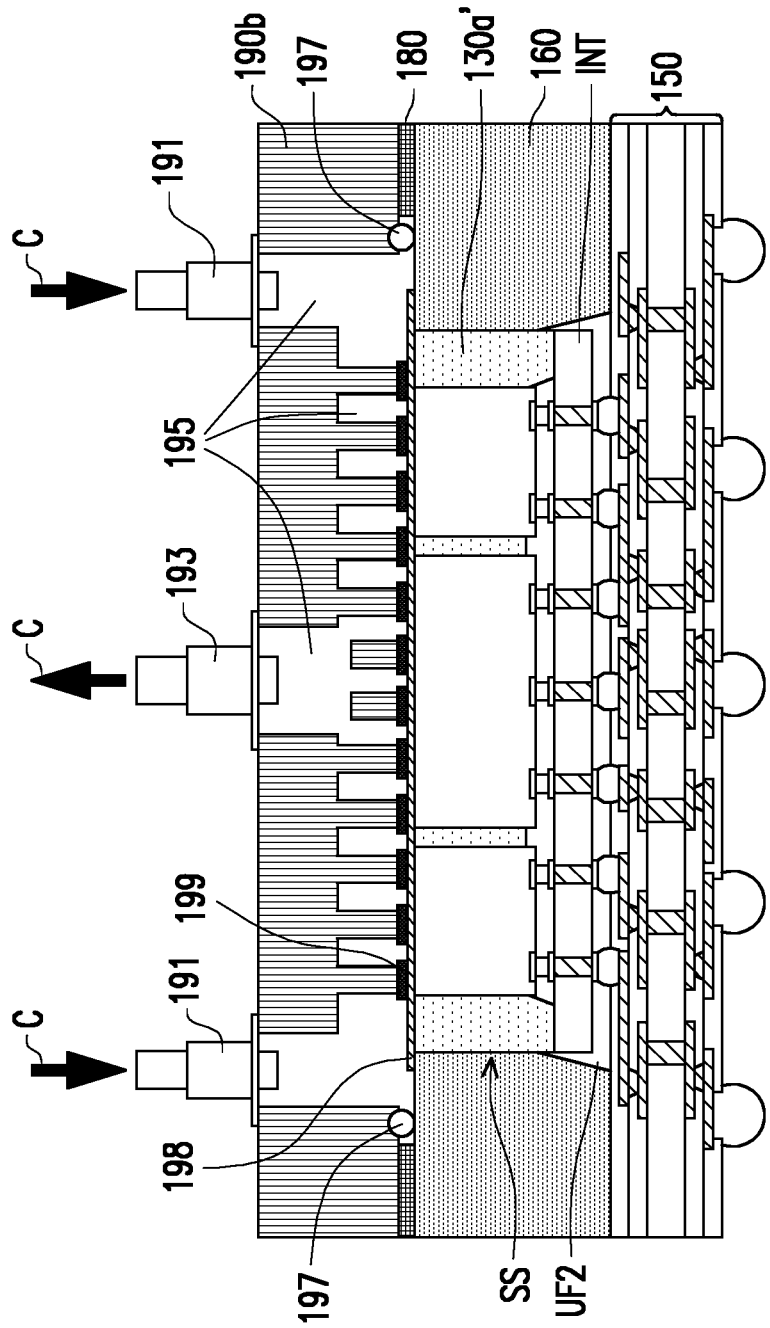

Referring to FIG. 21, the package structure P12 illustrated in FIG. 21 is similar to the CoWoS package structure P1 illustrated in FIG. 7 except that the package structure P12 includes a thermal enhanced lid 190b, and the lid 190b includes an inlet 191, an outlet 193 and flow channels 195, the flow channels 195 are in communicated with the inlet 191 and the outlet 193, and a coolant C enters the flow channel 195 through the inlet 191 and leaves the flow channel 195 through the outlet 193. In some embodiments, sidewalls of the insulating encapsulation 130a' are substantially aligned with sidewalls of the interposer INT.

As illustrated in FIG. 21, the package structure P12 may further include water-proof ring 197 (e.g., O-ring) disposed between the lid 190b and the insulating encapsulation 106 such that the coolant 197 can be confined within the flow channel 195. In addition, the package structure P12 may further include a backside metal 198 and solder material 199 on the backside metal 198, wherein the backside metal 198 covers the singulated structure SS and portions of the insulating encapsulation 160, the solder material 199 is disposed on the backside metal 198, and the solder material is sandwiched between the backside metal 198 and the lid 190b. The lid 190b is attached on the singulated structure SS through the backside metal 198 and the solder material 199, and the lid 190b is adhered with the insulating encapsulation 160 through the adhesive 180.

In the above-mentioned embodiments, since the singulated structure SS is laterally encapsulated by the insulating encapsulation 160, warpage of the package structures P1-P12 may be properly controlled. Furthermore, delamination issue happened in the package structures P1-P12 and crack issue of the conductive bumps (i.e. bumps 122a and 122b) may be minimized. The insulating encapsulation 160 in the package structures P1-P12 provides favorable support for the lid 190, 190a or 190b, and accordingly, fabrication yields of the package structures P1-P12 may increase.

In accordance with some embodiments of the disclosure, a structure including a wiring substrate, an interposer disposed on and electrically connected to the wiring substrate, a semiconductor die disposed on and electrically connected to the interposer, a first insulating encapsulation disposed on the interposer, a second insulating encapsulation disposed on the wiring substrate, and a lid is provided. The semiconductor die is laterally encapsulated by the first insulating encapsulation. The semiconductor die and the first insulating encapsulation are laterally encapsulated by the second insulating encapsulation. A top surface of the first insulating encapsulation is substantially leveled with a top surface of the second insulating encapsulation and a surface of the semiconductor die. The lid is disposed on the semiconductor die, the first insulating encapsulation and the second insulating encapsulation. In some embodiments, the structure further includes an adhesive disposed between the second insulating encapsulation and the lid; and a thermal interface material disposed between the semiconductor die and the lid. In some embodiments, the structure further includes a first metallic layer disposed between the thermal interface material and the semiconductor die; and a second metallic layer disposed between the thermal interface material and the lid. In some embodiments, the lid includes an inlet, an outlet and flow channels, the flow channels are in communicated with the inlet and the outlet, and a coolant enters the flow channel through the inlet and leaves the flow channel through the outlet. In some embodiments, sidewalls of the first insulating encapsulation are substantially aligned with sidewalls of the interposer. In some embodiments, a first top surface of the first insulating encapsulation is substantially leveled with a second top surface of the second insulating encapsulation. In some embodiments, the structure further includes an underfill disposed between the interposer and the wiring substrate, wherein the underfill is laterally encapsulated by the second insulating encapsulation. In some embodiments, the structure further includes a reinforcement structure embedded in the second insulating encapsulation. In some embodiments, the structure further includes a circuit board and a socket board disposed between the wiring substrate and the circuit board, wherein the wiring substrate is electrically connected to the circuit board through the socket board.

In accordance with some other embodiments of the disclosure, a structure including a wiring substrate, an interposer disposed on the wiring substrate, a semiconductor die disposed on the interposer, a first insulating encapsulation disposed on the interposer, an underfill filled between the wiring substrate and the interposer, a second insulating encapsulation disposed on the wiring substrate, and a heat sink is provided. The interposer is electrically connected to the wiring substrate through first conductive bumps. The semiconductor die is electrically connected to the interposer through second conductive bumps. The first insulating encapsulation laterally encapsulates the semiconductor die and the second conductive bumps. The underfill laterally encapsulates the first conductive bumps. The second insulating encapsulation laterally encapsulates the first insulating encapsulation and the underfill. The heat sink is attached to the semiconductor die, the first insulating encapsulation and the second insulating encapsulation through a thermal interface material. In some embodiments, the structure further includes an adhesive disposed between the second insulating encapsulation and the lid, wherein the adhesive surrounds and is in contact with the thermal interface material. In some embodiments, sidewalls of the first insulating encapsulation are substantially aligned with sidewalls of the interposer, and a first top surface of the first insulating encapsulation is substantially leveled with a second top surface of the second insulating encapsulation. In some embodiments, the structure further includes a circuit board, wherein the wiring substrate is electrically connected to the circuit board. In some embodiments, the structure further includes a socket board disposed between the wiring substrate and the circuit board, wherein the wiring substrate is electrically connected to the circuit board through the socket board. In some embodiments, the structure further includes a reinforcement structure embedded in the second insulating encapsulation. In some embodiments, the heat sink is fastened to the reinforcement structure through screws. In some embodiments, the heat sink is fastened to the reinforcement structure and the wiring substrate through screws.

In accordance with some other embodiments of the disclosure, a structure including a wiring substrate, an interposer disposed on and electrically connected to the wiring substrate, a semiconductor die disposed on and electrically connected to the interposer, a first insulating encapsulation disposed on the interposer, a second insulating encapsulation disposed on the wiring substrate, and a lid is provided. The semiconductor die is laterally encapsulated by the first insulating encapsulation. The semiconductor die and the first insulating encapsulation are laterally encapsulated by the second insulating encapsulation. The lid is disposed on the semiconductor die, the first insulating encapsulation and the second insulating encapsulation, wherein a minimum distance between the lid and the wiring substrate is greater than a maximum thickness of the second insulating encapsulation. In some embodiments, the structure further includes a thermal interface material disposed between the semiconductor die and the lid. In some embodiments, the minimum distance between the lid and the wiring substrate substantially equals to a sum of the maximum thickness of the second insulating encapsulation and a thickness of the thermal interface material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
a wiring substrate;
a device comprising a semiconductor die laterally encapsulated by a first insulating encapsulation, the semiconductor die being disposed on and electrical connected to the wiring substrate;
a second insulating encapsulation disposed on the wiring substrate, wherein the device is laterally encapsulated by the second insulating encapsulation;
a lid disposed on the device and the second insulating encapsulation;
a reinforcement structure embedded in the second insulating encapsulation; and
fastening elements penetrating through the lid, wherein the lid is fastened to the reinforcement structure through the fastening elements.

2. The structure as claimed in claim 1 further comprising:
an adhesive disposed between the second insulating encapsulation and the lid; and
a thermal interface material disposed between the semiconductor die and the lid.

3. The structure as claimed in claim 2 further comprising:
a first metallic layer disposed between the thermal interface material and the semiconductor die; and
a second metallic layer disposed between the thermal interface material and the lid.

4. The structure as claimed in claim 1, wherein the lid comprises an inlet, an outlet and flow channels, the flow channels are in communication with the inlet and the outlet, and a coolant enters the flow channel through the inlet and leaves the flow channel through the outlet.

5. The structure as claimed in claim 1, wherein the device further comprises an interposer, and the semiconductor die is disposed on and electrically connected to the interposer.

6. The structure as claimed in claim 5, wherein sidewalls of the first insulating encapsulation are substantially aligned with sidewalls of the interposer.

7. The structure as claimed in claim 5 further comprising:
an underfill disposed between the interposer and the wiring substrate, wherein the underfill is laterally encapsulated by the second insulating encapsulation.

8. The structure as claimed in claim 1, wherein the fastening elements are partially embedded in the reinforcement structure.

9. The structure as claimed in claim 1 further comprising:
a circuit board; and
a socket board disposed between the wiring substrate and the circuit board, wherein the wiring substrate is electrically connected to the circuit board through the socket board.

10. A structure, comprising:
a wiring substrate;
a device comprising a semiconductor die laterally encapsulated by a first insulating encapsulation, the semiconductor die being disposed on and electrically connected to the wiring substrate;
an underfill between the wiring substrate and the device;
a second insulating encapsulation disposed on the wiring substrate, wherein the second insulating encapsulation laterally encapsulates the first insulating encapsulation of the device and the underfill;
a heat sink attached to the device and the second insulating encapsulation through a thermal interface material; and
a reinforcement structure embedded in the second insulating encapsulation, wherein the heat sink is fastened to the reinforcement structure through screws.

11. The structure as claimed in claim 10 further comprising:
an adhesive disposed between the second insulating encapsulation and the heat sink, wherein the adhesive is in contact with the thermal interface material.

12. The structure as claimed in claim 10, wherein a first top surface of the first insulating encapsulation is substantially level with a second top surface of the second insulating encapsulation.

13. The structure as claimed in claim 10 further comprising:
a circuit board, wherein the wiring substrate is electrically connected to the circuit board.

14. The structure as claimed in claim 13 further comprising:
a socket board disposed between the wiring substrate and the circuit board, wherein the wiring substrate is electrically connected to the circuit board through the socket board.

15. The structure as claimed in claim 10, wherein the second insulating encapsulation is spaced apart from the screws by the reinforcement structure.

16. The structure as claimed in claim 15, wherein the screws are spaced apart from the wiring substrate by the reinforcement structure.

17. The structure as claimed in claim 10, wherein the heat sink is fastened to the reinforcement structure and the wiring substrate through screws.

18. A structure, comprising:
- a wiring substrate;
- an interposer disposed on and electrically connected to the wiring substrate;
- a semiconductor die disposed on and electrically connected to the interposer;
- a first insulating encapsulation disposed on the interposer, wherein the semiconductor die is laterally encapsulated by the first insulating encapsulation;
- a second insulating encapsulation disposed on the wiring substrate, wherein the semiconductor die and the first insulating encapsulation are laterally encapsulated by the second insulating encapsulation;
- a lid disposed on the semiconductor die, the first insulating encapsulation and the second insulating encapsulation; and
- a thermal interface material disposed between the semiconductor die and the lid, wherein a minimum distance between the lid and the wiring substrate substantially equals a sum of a maximum thickness of the second insulating encapsulation and a thickness of the thermal interface material.

19. The structure as claimed in claim 18 further comprising:
- an adhesive disposed between the second insulating encapsulation and the lid.

20. The structure as claimed in claim 19, wherein the minimum distance between the lid and the wiring substrate substantially equals a sum of the maximum thickness of the second insulating encapsulation and a thickness of the adhesive.

* * * * *